(12) United States Patent
Calhoun et al.

(10) Patent No.: US 9,337,204 B2
(45) Date of Patent: May 10, 2016

(54) MEMORY CELL

(71) Applicant: University of Virginia Patent Foundation, Charlottesville, VA (US)

(72) Inventors: Benton H. Calhoun, Charlottesville, VA (US); Randy W. Mann, Milton, NY (US)

(73) Assignee: UNIVERSITY OF VIRGINIA PATENT FOUNDATION, Charlottesville, VA (US)

( * ) Notice: Subject to any disclaimer, the term of this patent is extended or adjusted under 35 U.S.C. 154(b) by 0 days.

(21) Appl. No.: 14/611,732

(22) Filed: Feb. 2, 2015

(65) Prior Publication Data

US 2015/0147857 A1 May 28, 2015

Related U.S. Application Data

(63) Continuation of application No. 13/810,728, filed as application No. PCT/US2011/044691 on Jul. 20, 2011, now Pat. No. 8,947,912.

(60) Provisional application No. 61/365,962, filed on Jul. 20, 2010.

(51) Int. Cl.
| | |
|---|---|
| *G11C 11/00* | (2006.01) |
| *H01L 21/70* | (2006.01) |
| *H01L 27/11* | (2006.01) |
| *G11C 11/412* | (2006.01) |
| *H01L 21/28* | (2006.01) |
| *H01L 21/768* | (2006.01) |

(52) U.S. Cl.
CPC .......... *H01L 27/1104* (2013.01); *G11C 11/412* (2013.01); *H01L 21/28035* (2013.01); *H01L 21/28088* (2013.01); *H01L 21/28097* (2013.01); *H01L 21/768* (2013.01); *Y10S 257/903* (2013.01)

(58) Field of Classification Search
CPC ...................................................... G11C 11/412
USPC .......................................................... 365/156
See application file for complete search history.

(56) References Cited

U.S. PATENT DOCUMENTS

| | | | | |
|---|---|---|---|---|
| 6,404,024 B1 * | 6/2002 | Ishigaki | ................... | H01L 27/11 257/392 |
| 7,598,570 B2 * | 10/2009 | Hirano | ..................... | H01L 21/84 257/202 |
| 2008/0105932 A1 * | 5/2008 | Liaw | ....................... | H01L 27/11 257/401 |

* cited by examiner

*Primary Examiner* — Son Mai

(74) *Attorney, Agent, or Firm* — Kilpatrick Townsend & Stockton LLP

(57) ABSTRACT

Memory cells are described with cross-coupled inverters including unidirectional gate conductors. Gate conductors for access transistors may also be aligned with a long axis of the inverter gate conductor. Contacts of one inverter in a cross-coupled pair may be aligned with a long axis of the other inverter's gate conductor. Separately formed rectangular active regions may be orthogonal to the gate conductors across pull up, pull down and access transistors. Separate active regions may be formed such that active regions associated with an access transistor and/or a pull up transistor are noncontiguous with, and narrower than, an active region associated with a pull down transistor of the inverter. The major components of 6T SRAM, and similar, memory cell topologies may be formed essentially from an array of rectangular lines, including unidirectional gate conductors and contacts, and unidirectional rectangular active regions crossing gate conductors of the inverters and access transistors.

15 Claims, 22 Drawing Sheets

MEMORY CELL

CROSS-REFERENCES TO RELATED APPLICATIONS

This application is a continuation of U.S. patent application Ser. No. 13/810,728, filed Jan. 17, 2013, which is a national stage application of, and claims priority to, International Application No. PCT/US2011/044691 filed Jul. 20, 2011, which claims priority from U.S. Provisional Application Ser. No. 61/365,962, filed Jul. 20, 2010, the disclosures of which are hereby expressly incorporated herein by reference in their entirety.

BACKGROUND OF THE INVENTION

A static random access memory device (SRAM) may be used to store binary data. An SRAM device may be constructed from a number of memory cells, wherein each memory cell stores a single bit of data, that is a value of zero (0) or a value of one (1).

A memory cell may be constructed from two inverters (not-gates) that are cross-coupled. In this way, the output (high or low) of the first inverter is the opposite of the input of that inverter. That output is fed to the second inverter, which inverts it and feeds the value as input to the first inverter. Since there are two possible values and two inverters, any value input will persist in the circuit as long as it is powered.

Exemplary SRAM configurations may include memory cells with, for example, 4 transistor cells (4T), 6 transistor (6T) cells, 8 transistor (8T) cells or 10 transistor (10T) cells, as well as other hybrid designs. In various memory SRAM configurations, inverters may be created by using two connected transistors, one pull-up transistor (a PMOS transistor) and one pull-down transistor (an NMOS transistor). The cross-coupled inverter pair itself is thereby comprised of two PMOS transistors and two NMOS transistors. Two further NMOS transistors may be used to regulate access to the memory cell; these are known as access or pass-gate transistors. This layout comprising six transistors is known as a 6T cell or a 6T topology.

There are a number of known ways of creating 6T SRAM memory cells, and these may be dependent on different factors, such as processing capability of the technology, performance, density, power, and functional objectives. A summary of known bit cell topologies is provided by Ishida and shown in FIG. 1. 1. M. Ishida, T. Kawakami, A. Tsuji, N. Kawamoto, M. Motoyoshi, and N. Ouchi. "A novel 6t-sram cell technology designed with rectangular patterns scalable beyond 0.18 & generation and desirable for ultra high speed operation". In Proc. International Electron Devices Meeting IEDM '98 Technical Digest, pages 201-204, 6-9 Dec. 1998.

When scaling a 6T cell below 90 nm, the lithographic challenges in printing and controlling the dimensions within the same printed layer in orthogonal directions has become increasingly difficult. This has led to a restriction in layout for printed layers that require extremely tight control in printed dimension. For the SRAM devices it is therefore advantageous for the active single crystal regions and gate layer to be printed orthogonally thus allowing tight dimensional control for these layers.

One important source of mismatch can be attributed to the "jogs" in the printed design, as are typically needed and used in the type-4 cell design in the active silicon printed pattern. Such "jogs" may be necessary in current designs, for example, to provide different widths of an active region spanning pull down and access (pass gate) transistors, as shown in FIG. 2-3. In general, wider active areas are needed at the pull down transistor, compared to the access transistor to maintain stability during read operations, and wider active areas are needed at the access transistor, compared to the pull up transistor, to maintain stability during write operations. As also shown in FIGS. 3-4, these "jogs" will print with some degree of corner rounding leading to an extended region of non uniformity. Normal corner rounding that occurs during the fabrication process leads to alignment sensitivity for the PD device width. This sensitivity is asymmetrical, such that the left and right PD devices become more different with misalignment. When alignment of the next printed level intersects the region near the jog where rounding has occurred, a non uniform channel will be created and because of the symmetry associated with the industry standard Type-4 topology, device mismatch between the right and left side of the bit cell is created, e.g. between N3 and N4 shown in FIG. 4. The devices circled exhibit different width characteristics and the width of N3 is effectively less than that of N4.

Other non-linear features used in some known designs, such as the M1 lines in the topology shown in FIG. 5, can also increase scaling difficulties and/or induce irregularities in memory cells.

Embodiments of the present invention include memory cell configurations and topologies that overcome some of these and/or other known limitations in the area of memory cell design, and SRAM designs in particular.

BRIEF SUMMARY OF THE INVENTION

The extent to which the 6T SRAM bit cell and the like can be perpetuated through continued scaling is of enormous technological and economic importance. To this end, the inventors have analyzed the growing limitations in lithography, design and process technology, coupled with the mechanisms which drive systematic mismatch, to provide direction in identifying more optimum solutions.

According to aspects of the invention, various ultra-thin (UT) SRAM cells, and other layout topologies are presented which may be effective in addressing challenging bit cell design constraints facing the most advanced CMOS process technologies today. The inventors have found that, compared to, for example, the industry standard 6T topology, cells including features of the invention may provide, among other objects, a lower bit line capacitance, reduced M1 complexity and/or notchless design for improved resistance to alignment induced device mismatch.

An aspect of an embodiment of the present invention includes, but is not limited thereto, cell design structure (layout topology), which may provide, for example:

(1) improved compatibility with state of the art manufacturing lithography practices, (2) reduced MOSFET device variability by eliminating jogs in active, gate and local interconnect levels, (3) high density planar compact layout with rectangular symmetry for low cost, and/or (4) low capacitance bit lines can be achieved because of the cell dimension parallel with the bit line.

According to further aspects of the invention, a memory cell with a pair of cross-coupled inverters may include a first inverter, with a first gate conductor and a first contact, and a second inverter with a second gate conductor and a second contact. In embodiments, the first gate conductor and/or the second gate conductor may be substantially rectangular. As used herein, unless otherwise specified, "substantially rectangular" should be understood as including shapes running substantially in a single direction and without notches, "jogs"

or indentations in the sides of the shaped element. These may include elongated rectangles and/or substantially square shapes. It should also be noted that some rounding of the corners, or ends, of the shapes, as may result from patterning techniques known in the art, may be acceptable without departing from the meaning of "substantially rectangular"

In embodiments, the second contact may be substantially aligned with a long axis of the first gate conductor, and/or the first contact may be substantially aligned with a long axis of the second gate conductor.

As used herein, unless otherwise specified, "substantially aligned" with an axis may allow for various deviations, for example, in patterning processes and the like, as well as minor offsets, such as where a part of the material of one feature is inline with the recited axis, etc.

In embodiments, the first gate conductor and the second gate conductor may be substantially formed using, for example, polycrystalline silicon, metal, and other materials known in the art.

Embodiments may include a first active region that intersects at least one of the first gate conductor and the second gate conductor in plan view, and a second active region that intersects at least one of the first gate conductor and the second gate conductor in plan view. Various active regions recited herein, such as the first and second active regions, may be, for example, substantially rectangular. In embodiments, the second active region may be non-contiguous with the first active region and may have a width in plan view that is greater than a width of the first active region in plan view.

In embodiments, each of the first and second substantially rectangular active regions may have a long axis that is substantially orthogonal to the long axis of the gate conductor that is intersected by the first and second substantially rectangular active regions.

In embodiments, such as when the first and second active regions intersect the first gate conductor in plan view, exemplary devices may also include a third, substantially rectangular, active region that intersects the second gate conductor in plan view, and a fourth, substantially rectangular, active region that intersects the second gate conductor in plan view. The fourth active region may be non-contiguous with the third active region and may have a width in plan view that is greater than a width of the third active region in plan view.

In embodiments, the first inverter may include a first pull up transistor and a first pull down transistor, and the second inverter may include a second pull up transistor and a second pull down transistor. The first pull up transistor may include the intersection of the first gate conductor and the first active region, the first pull down transistor may include the intersection of the first gate conductor and the second active region, the second pull up transistor may include the intersection of the second gate conductor and the third active region, and/or the second pull down transistor may include the intersection of the second gate conductor and the fourth active region.

In embodiments, the first contact may include a substantially rectangular extended shared contact region having a long axis and/or the second contact may include a substantially rectangular extended shared contact region having a long axis. The first active region and the second active region may be electrically connected to the first contact, and/or the third active region and the fourth active region may be electrically connected to the second contact. In embodiments, the long axis of the first contact, the long axis of the second contact, and the long axis of at least one of the first gate conductor and the second gate conductor may be substantially parallel.

Embodiments may include a plurality of metal lines including a plurality of substantially rectangular metallic regions each having a long axis, wherein the long axes of the metal lines are substantially parallel.

Embodiments may include a plurality of metal lines including a plurality of substantially rectangular metallic regions each having a long axis, e.g. a first metal line and a second metal line, wherein the long axis of the second metal line is substantially aligned with the first gate conductor and/or the long axis of the first metal line is substantially aligned with the second gate conductor.

Embodiments may include one or more access transistors having a gate conductor substantially aligned with a long axis of one or more of the gate conductors. For example, a first access transistor may have a gate conductor substantially aligned with a long axis of the first gate conductor, and/or a second access transistor may have a gate conductor substantially aligned with a long axis of the second gate conductor. In embodiments, a second substantially rectangular active region may intersect at least one of the first gate conductor and the second gate conductor in plan view, and a fifth substantially rectangular active region may be provided that intersects the gate conductor of the access transistor in plan view. The second active region may be non-contiguous with the fifth active region and may have a width in plan view that is greater than a width of the fifth active region in plan view. In embodiments, the access transistor may include the intersection of the gate conductor of the access transistor, and the fifth active region.

Embodiments may include a buried conductive layer providing connection for one or more of a PMOS diffusion, a pull down transistor diffusion, and/or an access transistor diffusion on each side of the memory cell. The buried conductive layer may be, for example, disposed lying vertically below, and electrically insulated from, a metal 1 (M1) layer.

In embodiments, the cross-coupled inverters may be included in, for example, a 6T SRAM, an 8T transistor SRAM, or a 10T SRAM.

According to further aspects of the invention, a memory cell may include a plurality of substantially rectangular gate conductors, a plurality of substantially rectangular active regions, and a plurality of metal lines (M1). The plurality of gate conductors may be substantially orthogonal to the plurality of active regions.

In embodiments, each active region may have a long axis. The long axes of the active regions may be substantially parallel.

In embodiments, the plurality of active regions may include a first active region and a second active region intersecting at least one of the plurality of gate conductors in plan view, and the second active region may be non-contiguous with the first active region and have a width in plan view that is larger than a width of the first active region.

In embodiments, the plurality of metal lines (M1) may be substantially rectangular, each of the plurality of gate conductors may be substantially parallel to one another, the plurality of active regions may be substantially parallel to one another, and the plurality of metal lines (M1) may be substantially parallel to the plurality of gate conductors.

Embodiments may include a first inverter and a second inverter. In embodiments, the plurality of gate conductors may include a first gate conductor of the first inverter and a second gate conductor of the second inverter. The first inverter may include a first pull up transistor and a first pull down transistor, and the second inverter may include a second pull up transistor and a second pull down transistor. The plurality of active regions may include a first active region, a second active region, a third active region and a fourth active region. In embodiments, the first pull up transistor may include the intersection of the first gate conductor and the first active region; the first pull down transistor may include the intersection of the first gate conductor and the second active region; the second pull up transistor may include the intersection of the second gate conductor and the third active region; and the second pull down transistor may include the intersection of the second gate conductor and the fourth active region.

Embodiments may include a first substantially rectangular extended shared contact region having a long axis and/or a second substantially rectangular extended shared contact region having a long axis. In embodiments, the first active region and the second active region may be electrically connected to the first extended shared contact region and/or the third active region and the fourth active region may be electrically connected to the second extended shared contact region. In embodiments, the long axis of the first extended shared contact region, the long axis of the second extended shared contact region, and/or the long axis of at least one of the first gate conductor and the second gate conductor may be substantially parallel.

In embodiments; the plurality of metal lines may include a first metal line having a long axis and a second metal line having a long axis. In embodiments, the long axis of the second metal line may be substantially aligned with the first gate conductor; and the long axis of the first metallic line may be substantially aligned with the second gate conductor.

Embodiments may include at least one access transistor, wherein a gate conductor of the at least one access transistor may be aligned with a long axis of a first gate conductor in plan view. In embodiments, the plurality of active regions may include a second active region intersecting the first gate conductor in plan view, and a fifth active region intersecting the gate conductor of the access transistor in plan view. In embodiments, the second active region may be non-contiguous with the fifth active region and have a width in plan view that is larger than a width of the fifth active region. In embodiments, the access transistor may include the intersection of the gate conductor of the access transistor and the fifth active region.

Embodiments may include a buried conductive layer providing connection for one or more of a PMOS diffusion, a pull down transistor diffusion, and an access transistor diffusion on each side of the memory cell.

According to further aspects of the invention, a method of forming a memory cell may include forming a first substantially rectangular gate conductor; forming a gate conductor of a first access transistor; forming a first contact; forming a second substantially rectangular gate conductor; forming a gate conductor of a second access transistor; and forming a second contact. At least one of the gate conductor of the first access transistor and the second contact may be disposed at a location substantially aligned with a long axis of the first gate conductor, and/or at least one of the gate conductor of the second access transistor and the first contact may be disposed at a location substantially aligned with a long axis of the second gate conductor.

In embodiments, forming the first substantially rectangular gate conductor and the second substantially rectangular gate conductor may include one or more of patterning a substantially rectangular spacer; patterning a first substantially rectangular gate conductor adjacent to the spacer; patterning a second substantially rectangular gate conductor adjacent to the spacer, such that the spacer is positioned between the first gate conductor and the second gate conductor; and removing the spacer.

In embodiments, forming the first substantially rectangular gate conductor and the gate conductor of a first access transistor may include patterning a single substantially rectangular gate conductor; and removing a section of said gate conductor to leave the first gate conductor and the gate conductor of the first access transistor.

Embodiments may include forming a first active region, a second active region, a third active region and a fourth active region. A first inverter may be formed including the first gate conductor, a first pull up transistor and a first pull down transistor. A second inverter may be formed including the second gate conductor, a second pull up transistor and a second pull down transistor. The first pull up transistor may be formed including the intersection of the first gate conductor and the first active region. The first pull down transistor may be formed including the intersection of the first gate conductor and the second active region. The second pull up transistor may be formed including the intersection of the second gate conductor and the third active region. The second pull down transistor may be formed including the intersection of the second gate conductor and the fourth active region.

Embodiments may include forming a fifth active region that intersects the gate conductor of the first access transistor in plan view and that is substantially parallel to the second active region, and/or forming a sixth active region that intersects the gate conductor of the second access transistor in plan view and that is substantially parallel to the fourth active region.

In embodiments, the first access transistor may be formed including the intersection of the gate conductor of the first access transistor and the fifth active region, and/or the second access transistor may be formed including the intersection of the gate conductor of the second access transistor and the sixth active region.

In embodiments, the first contact may be formed including a substantially rectangular extended shared contact region having a long axis, and/or the second contact may be formed including a substantially rectangular extended shared contact region having a long axis. The first active region and the second active region may be formed to be electrically connected to the first contact, and/or the third active region and the fourth active region may be formed to be electrically connected to the second contact. The long axis of the first contact, the long axis of the second contact, and/or the long axis of the first gate conductor may be formed to be substantially parallel.

In embodiments, the substantially rectangular gate conductors and the gate conductors of the access transistors may be formed substantially unidirectionally.

In embodiments, forming a plurality of metal lines may include forming a first substantially rectangular metal line having a long axis; and forming a second substantially rectangular metal line having a long axis, wherein the long axis of the first metal line is formed to be substantially aligned with the second gate conductor and the long axis of the second metallic line is formed to be substantially aligned with the first gate conductor.

According to further aspects of the invention, various other methods of manufacturing memory cells having configurations as described herein may also be provided.

Additional features, advantages, and embodiments of the invention may be set forth or apparent from consideration of the following detailed description, drawings, and claims. Moreover, it is to be understood that both the foregoing summary of the invention and the following detailed description are exemplary and intended to provide further explanation without limiting the scope of the invention claimed. The detailed description and the specific examples, however, indicate only preferred embodiments of the invention. Various changes and modifications within the spirit and scope of the invention will become apparent to those skilled in the art from this detailed description.

BRIEF DESCRIPTION OF THE DRAWINGS

The accompanying drawings, which are included to provide a further understanding of the invention, are incorporated in and constitute a part of this specification, illustrate embodiments of the invention and together with the detailed description serve to explain the principles of the invention. No attempt is made to show structural details of the invention in more detail than may be necessary for a fundamental understanding of the invention and various ways in which it may be practiced. In the drawings.

DETAILED DESCRIPTION OF THE INVENTION

Figure 1:
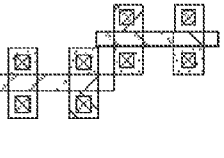
FIG. 1 shows examples of related art inverter and SRAM cell layouts.

It is understood that the invention is not limited to the particular methodology, protocols, and configurations, etc., described herein, as these may vary as the skilled artisan will recognize. It is also to be understood that the terminology used herein is used for the purpose of describing particular embodiments only, and is not intended to limit the scope of the invention. It also is be noted that as used herein and in the appended claims, the singular forms "a," "an," and "the" include the plural reference unless the context clearly dictates otherwise. Thus, for example, a reference to "a conductor" is a reference to one or more conductors and equivalents thereof known to those skilled in the art.

Unless defined otherwise, all technical and scientific terms used herein have the same meanings as commonly understood by one of ordinary skill in the art to which the invention pertains. The embodiments of the invention and the various features and advantageous details thereof are explained more fully with reference to the non-limiting embodiments and examples that are described and/or illustrated in the accompanying drawings and detailed in the following description. It should be noted that the features illustrated in the drawings are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the invention. The examples used herein are intended merely to facilitate an understanding of ways in which the invention may be practiced and to further enable those of skill in the art to practice the embodiments of the invention. Accordingly, the examples and embodiments herein should not be construed as limiting the scope of the invention, which is defined solely by the appended claims and applicable law. Moreover, it is noted that like reference numerals reference similar parts throughout the several views of the drawings.

Although various embodiments may be described in the context of a planar 6T SRAM architecture for clarity, the invention encompasses and may be applied to other types of SRAM, read buffers, etc. with different types of read and write access structures, as will be appreciated by those of skill in the art upon review of the contents herein. Moreover, various non-planar CMOS, Thin Film Transistor (TFT), silicon on insulator (SOI), partially depleted SOI (PDSOI), fully depleted SOI (FDSOI), extra thin SOI (ETSOI), Tri-Gate, and finFET devices may be designed and/or fabricated according to aspects of the invention.

Figure 2:
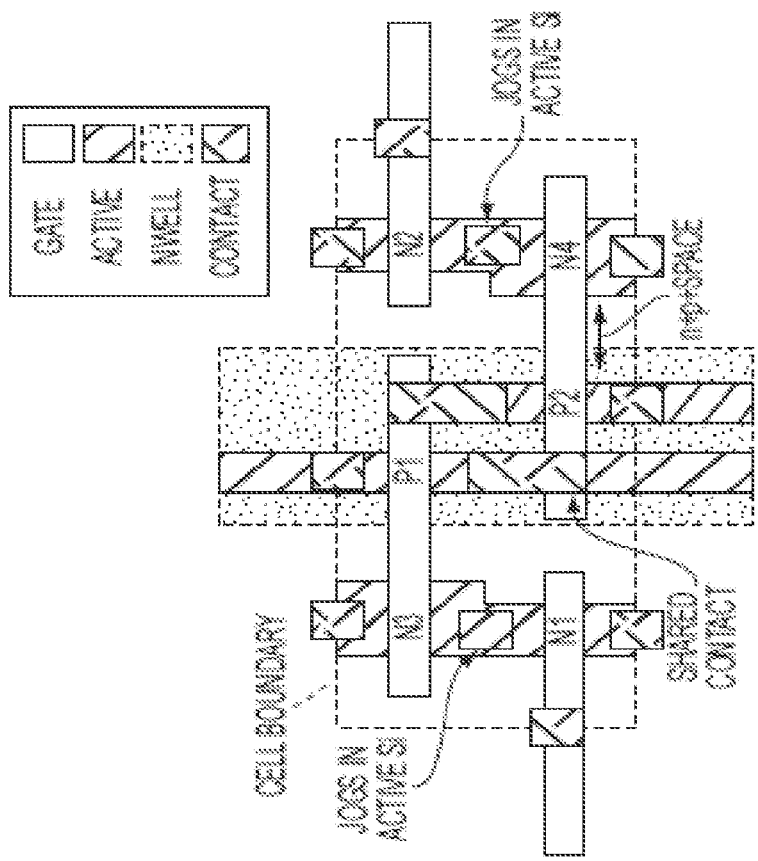
FIG. 2 shows a related art Type-4 SRAM cell layout including active areas with jogs.
Figure 3:
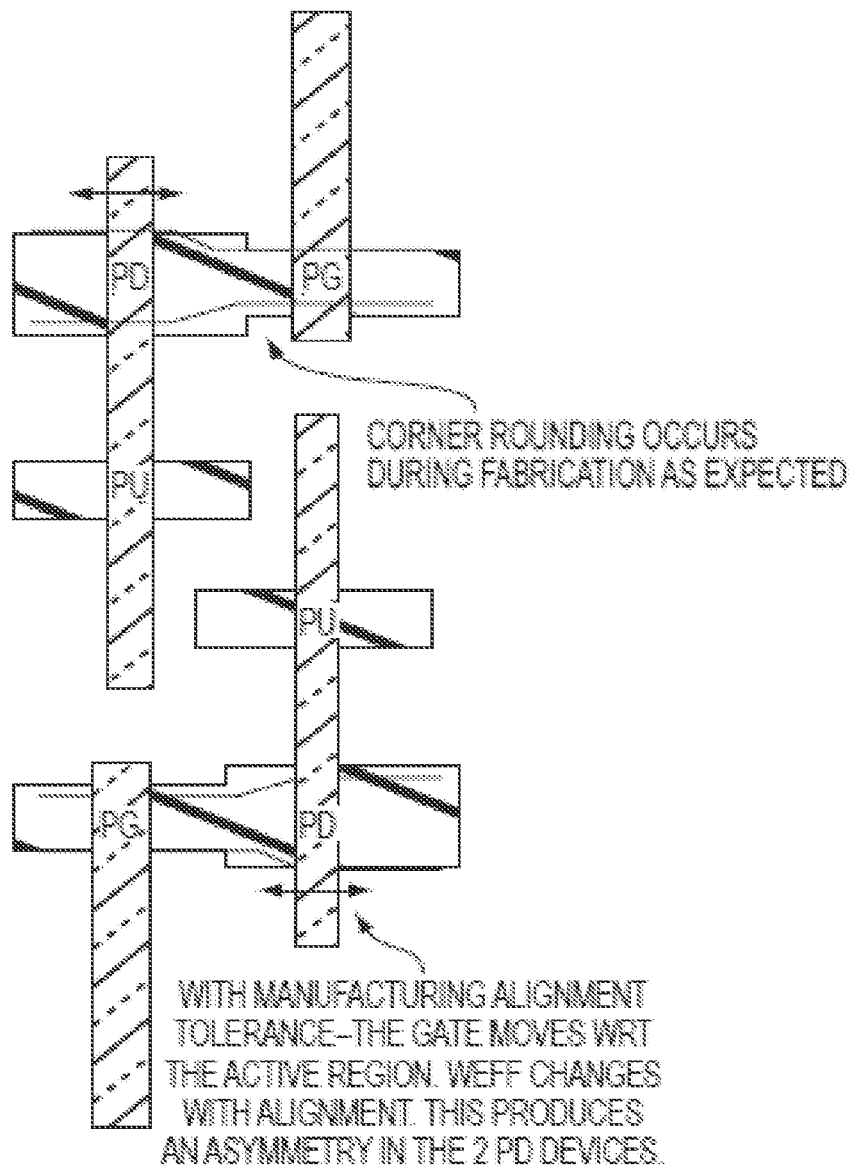
FIGS. 3-4 show additional details of a related art cell topology, such as shown in FIG. 2, including corner rounding as would typically be found at the sites of the jogs in the active areas as formed.

As mentioned above, a feature common to current 6T, and similar, memory cell designs is that one or more of the active regions is formed with a notch such that is has a narrower part and a wider part. Relatedly, in current designs, gate conductors of the access transistor may typically be located opposite the pull down transistor, such as shown in FIG. 3, with a contiguous active region spanning the access transistor and the pull down transistor. In this regard, it should be understood that "active regions" as described herein, may be considered contiguous, even if they are drawn with separations that are intended to be bridged when voltage is applied. That is, a single "active region" may typically be drawn in SRAM designs including, for example, a separation beneath the transistor gate. Therefore, the active region spanning N1 and N3, and extending partially beyond N1 and N3, in FIG. 2 may be understood as "contiguous," although separated beneath N1 and/or N3. On the contrary, according to aspects of the invention, various "non-contiguous" active areas may be described that are not merely separated under the transistor gate, but may be separately formed and span, for example, a single access transistor, a single pull down transistor or a single pull up transistor.

Figure 6:
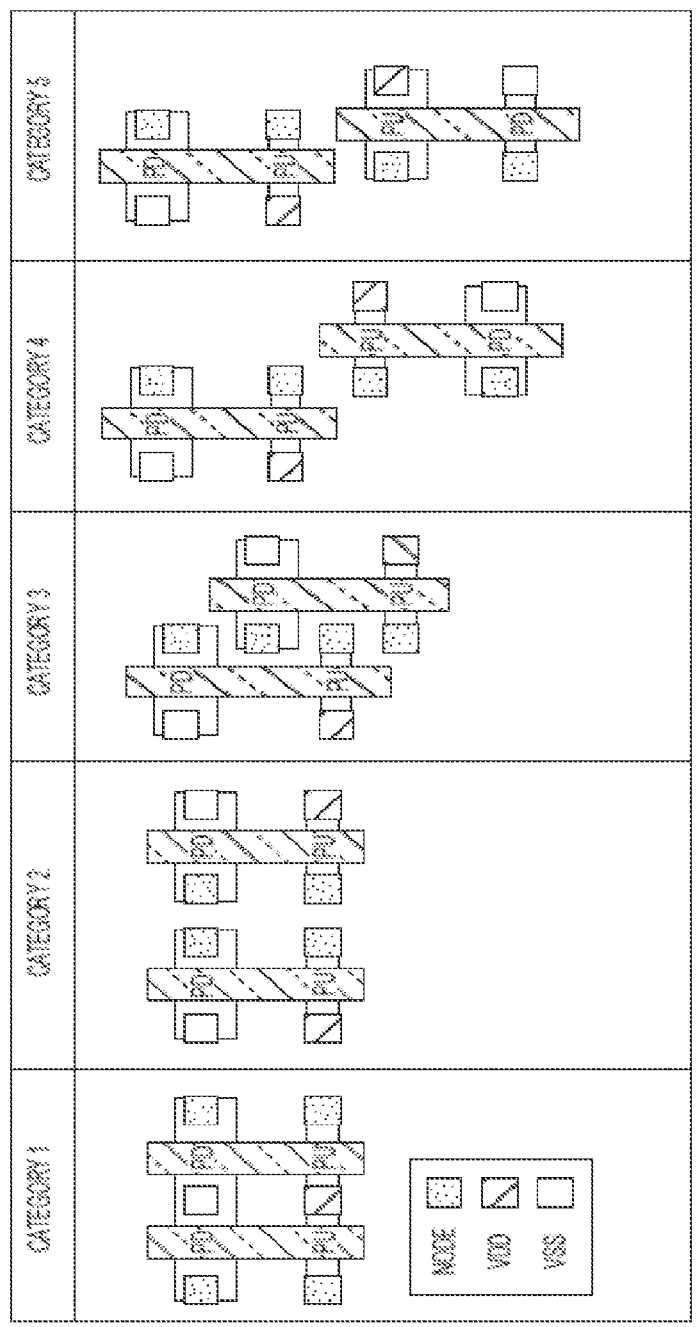
FIG. 6 shows an exemplary Category 5 inverter layout according to aspects of the invention, compared to related art Category 1-4 layouts.

FIG. 6 includes a new "Category 5" inventor layout according to aspects of the invention shown in relation to previously defined categories for the 6T cell inverter layout options. In the new "Category 5" topology, the cross coupled inverters may be shifted so that the gate of the second inverter is substantially in line with the contacts of the first inverter. This allows several other advantages and features discussed further below.

Figure 7A:
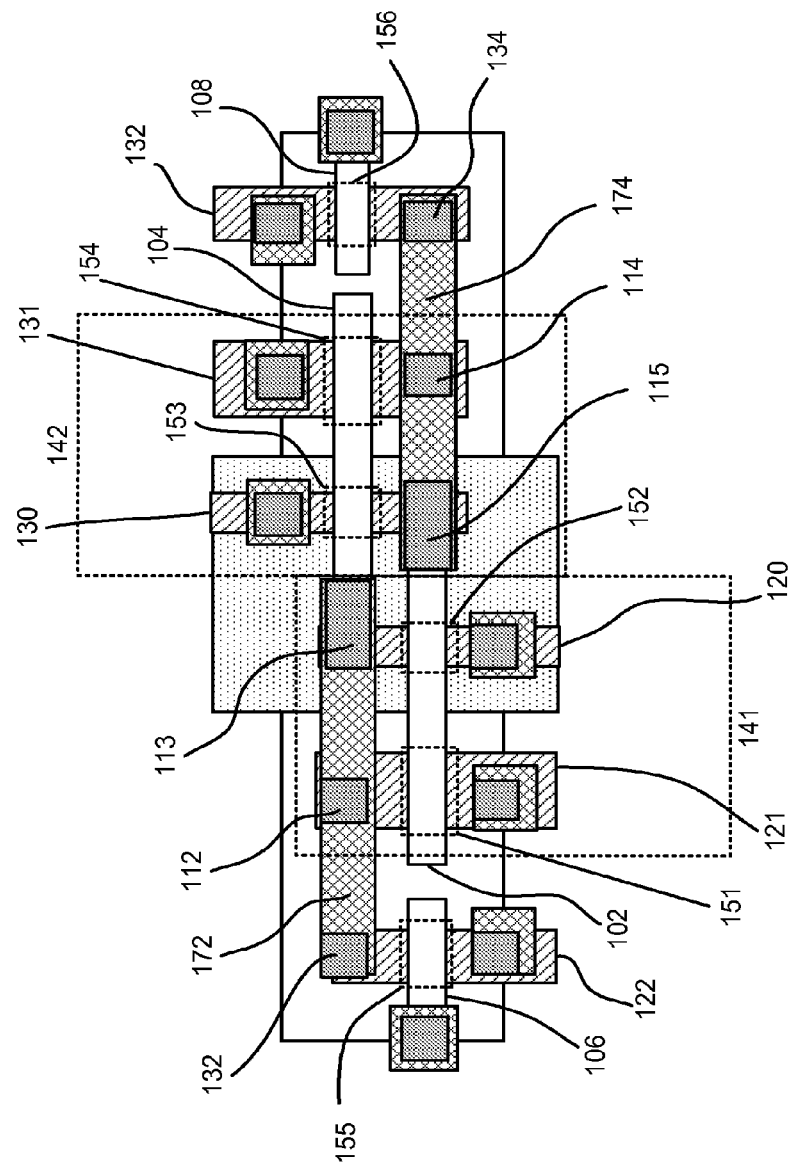
FIGS. 7A-7C show plan view details of an exemplary memory cell according to aspects of the invention.
Figure 7B:
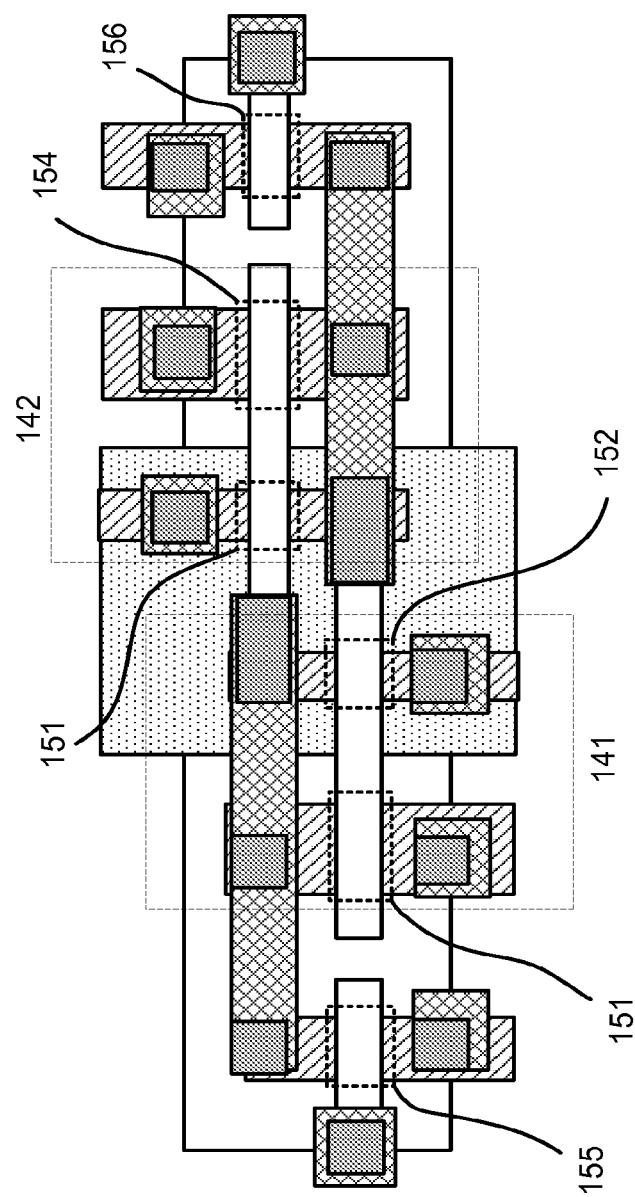
Figure 7C:
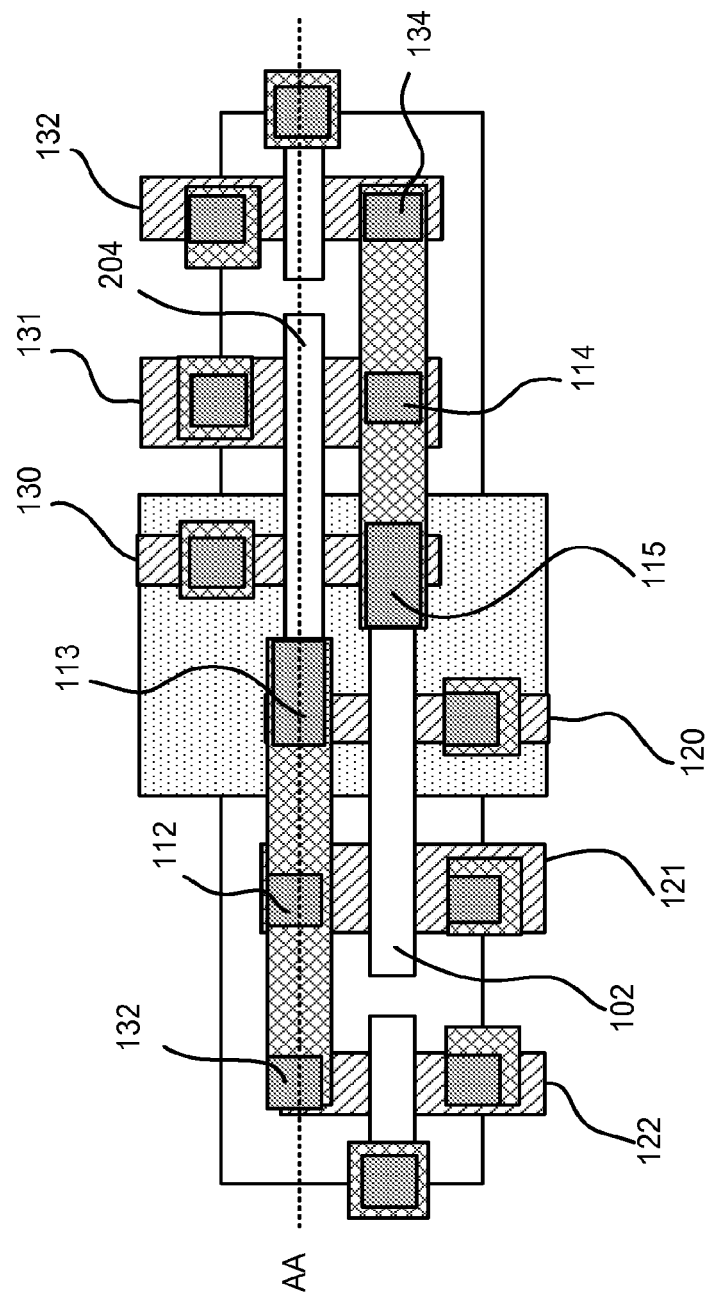

An embodiment of the present invention may include, for example, a memory cell topology with six active regions which are all substantially rectangular. An example of such a layout is shown in FIGS. 7A-7C. This may be referred to herein as a "Type 5" design. The diagrams show the memory cells comprising components being nearly perfectly shaped. When these components are produced at microscopic scale they may appear somewhat different; for example, corners may be rounded and edges may include imperfections related to materials and/or manufacturing process. Small square-shaped components may appear somewhat circular and rectangles may appear to be somewhat cigar shaped. Nonetheless, the six substantially rectangular active regions shown in FIGS. 7A-7C can easily be distinguished from those in the described existing designs that rely on a difference in width of areas of the active areas, as can be seen in FIG. 2. Additionally, such shapes may have contours in other directions, e.g. depth, that are not fully depicted in the figures, such as curved overlaps with underlying materials, etc.

As shown in FIGS. 7A-7C, a memory cell may include a pair of cross coupled inverters 141, 142. The first inverter 141 may include first gate conductor 102, first contact 112, first pull up transistor 152, first pull down transistor 151, and first metal line 172. The second inverter 142 may include second gate conductor 104, second contact 114, second pull up transistor 153, second pull down transistor 154, and second metal line 174. The first gate conductor 102, and the second gate conductor 104 are shown as substantially rectangular. The second contact 114 is substantially aligned with a long axis of the first gate conductor 102 and the first contact 112 is substantially aligned with a long axis of the second gate conductor 104. The gate conductors described herein may be substantially formed using, for example, polycrystalline silicon, metal, and other materials known in the art.

As further shown in FIGS. 7A-7C, the memory cell may include a plurality of active regions including, for example, first active region 120, second active region 121, third active region 130, fourth active region 131, fifth active region 122, and sixth active region 132. Each of these active regions is depicted as substantially rectangular and non-contiguous with any of the other active regions shown.

First active region 120 may intersect the first gate conductor 102 at the first pull up transistor 152, second active region 121 may intersect the first gate conductor 102 at the first pull down transistor 151, third active region 130 may intersect the second gate conductor 104 at the second pull up transistor 153, and fourth active region 131 may intersect the second gate conductor 104 at the second pull down transistor 154.

The memory cell may also include a first access transistor 155 at the junction of the fifth active region 122 and the gate conductor 106, and a second access transistor 156 at the junction of the sixth active region 132 and the gate conductor 108. As can be seen in FIG. 7A, the gate conductor 106 of the first access transistor may be aligned with a long axis of the first gate conductor 102, and the gate conductor 108 of the second access transistor may be aligned with a long axis of the second gate conductor 104. Such designs may allow for easy fabrication of the gate conductors by forming unilateral conductor lines, which may be separated later. A similar method may be applied to forming diffusions among adjacent cells, as discussed further below. Additionally, such designs may allow for the separately formed, non-contiguous active regions for the access transistor, pull down transistor and pull up transistor. As also shown in FIGS. 7A-7C, the active regions 121 and 131 associated with the pull down transistors 151 and 154, may be formed to be wider than the active regions 120, 130 associated with the pull up transistors 152, 153, and/or wider than the active regions 122, 132 associated with the access transistors 155, 156.

Contacts 115, 114 and 134 may also be substantially aligned with the long axis of the first gate conductor 102. Likewise, contacts 113, 112 and 132 may be substantially aligned with the long axis of the second gate conductor 104. The first and second metal lines 172, 174 may be substantially rectangular and may be substantially parallel to one another. The long axis of the second metal line 174 may be substantially aligned with the first gate conductor 102 and/or the long axis of the first metal line 172 may be substantially aligned with the second gate conductor 104.

Figure 8:
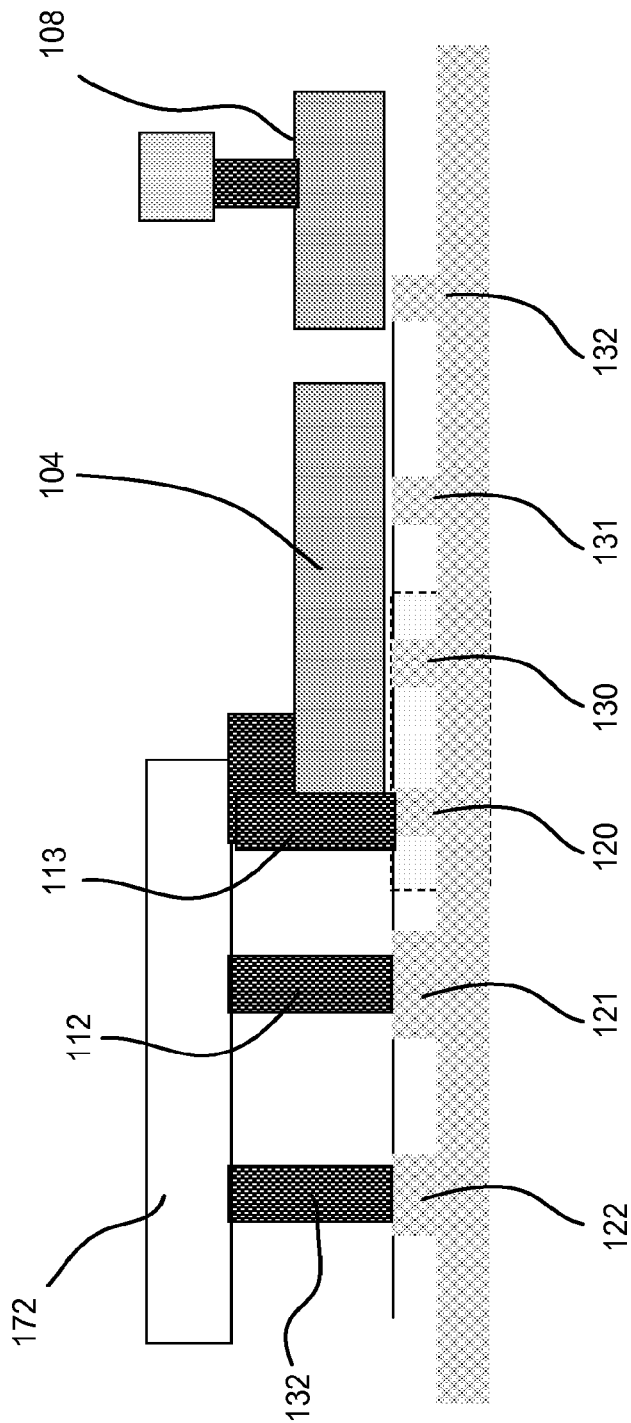
FIG. 8 shows aspects of a cross sectional view as may be found in the embodiment depicted in FIGS. 7A-7C.

As further shown in FIGS. 7A-7C, all, or some, of the first through sixth substantially rectangular active areas 120, 121, 122, 130, 131, 132 may have a long axis that is substantially orthogonal to the long axis of the gate conductor they intersect in plan view. As will be appreciated considering the features depicted in FIGS. 7A-7C, according to aspects of the invention, separate diffusion may be provided for the pass-gate (access) and pulldown transistors. Additional cross sectional details of this exemplary memory cell, cut along line AA in FIG. 7C, are shown in FIG. 8.

The inventors have identified several advantages for future generation technologies with this new layout topology. For example, the metal 1 (M1) complexity may be reduced to unidirectional routing, further simplifying the required pattern compared to the type 4 cell. Additionally, the cell height may be further reduced (in the bit line direction), which allows for a reduced bit line capacitance, and the jogs or notches in the active silicon region may be eliminated while still allowing for separate control of the widths of the pass gate and pull down devices.

Figure 9:
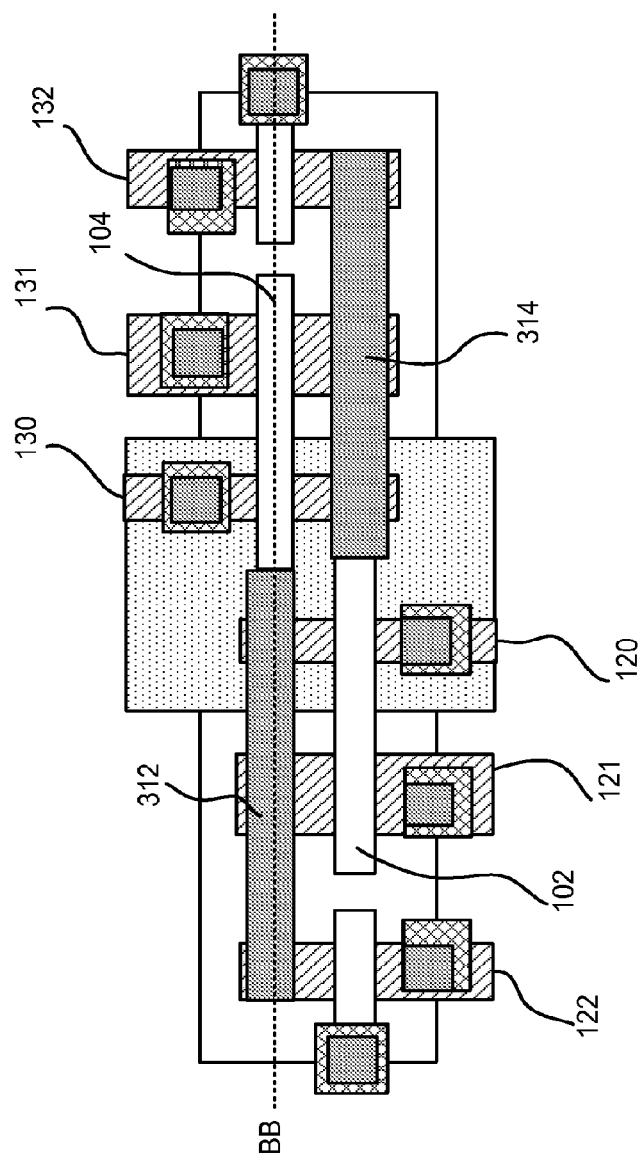
FIG. 9 shows plan view details of another exemplary memory cell including a shared contact according to further aspects of the invention.
Figure 10:
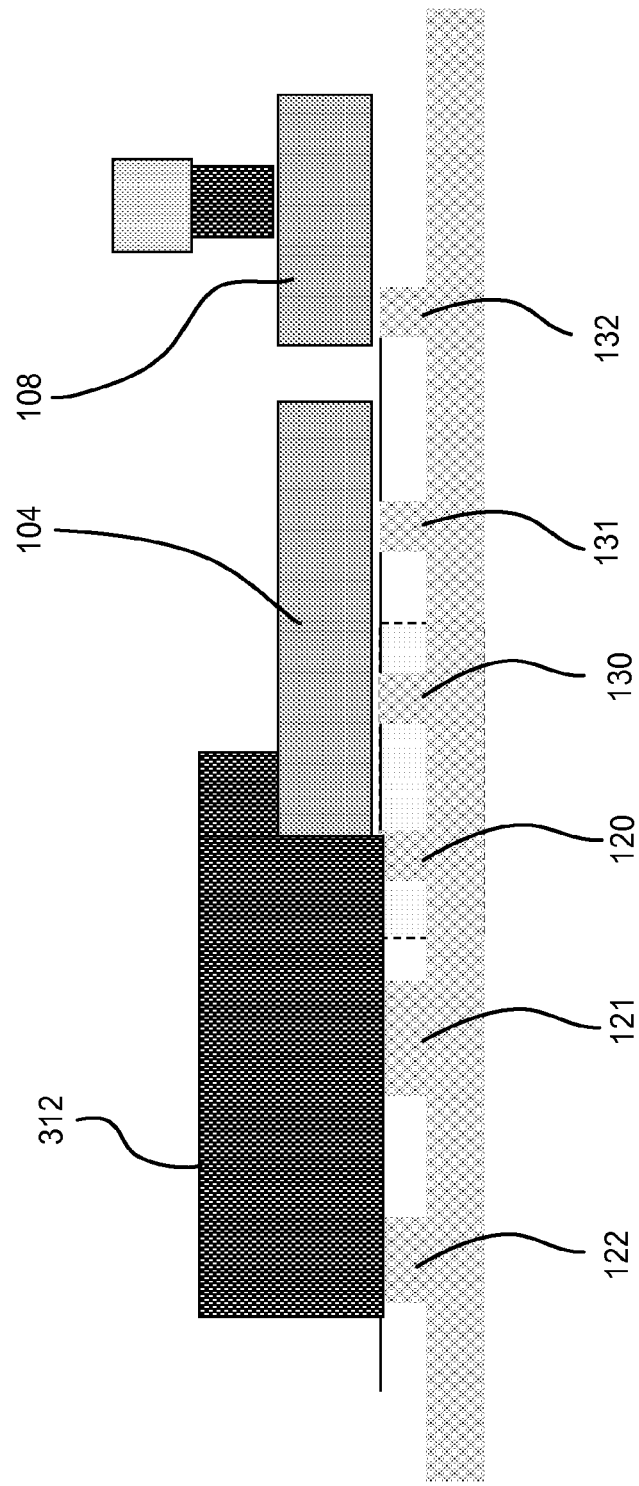
FIG. 10 shows aspects of a cross sectional view as may be found in the embodiment depicted in FIG. 9.

According to further aspects of the invention, a substantially rectangular extended shared contact region may be included in certain embodiments. An example of such a configuration is shown in FIGS. 9-10. This may be referred to herein as a "Type 5e" design. The embodiment shown in FIG. 9 has several features similar to those previously described, such as substantially rectangular active areas 120, 121, 122, 130, 131, 132, and first and second gate conductors 102, 104. However, this embodiment includes a first shared contact 312 and a second shared contact 314, that span the active areas 120, 121, 122 and 130, 131, 132, respectively, in plan view. The shared contacts 312, 314 have long axes that are substantially parallel to one another. The first active region 120 and the second active region 121 may be electrically connected to the first shared contact 312, and/or the third active region 130 and the fourth active region 131 may be electrically connected to the second shared contact 314. The first shared contact 312 is substantially aligned with the long axis of the second gate conductor 104, and the second shared contact 314 is substantially aligned with first gate conductor 102. Thus, the shared contacts may be configured to connect the PMOS diffusion, pull down diffusion, and pass gate (access) diffusion on each side of the cell.

It should be noted that a further improvement regarding embodiments of the present invention may be obtained by replacing the metal 1 (M1) used to connect the internal nodes with the local interconnect or shared contact layer, such as shown in FIG. 9. The extended shared contact may be formed with no jogs, and the cross couple may be completed along with the required internal node connections. The VDD, VSS and BL may be completed with, for example, M2 and extend vertically in the drawing. An M3 may be used for the word line (WL). Additional cross sectional details of this exemplary memory cell, cut along line BB in FIG. 9, are shown in FIG. 10.

Figure 11:
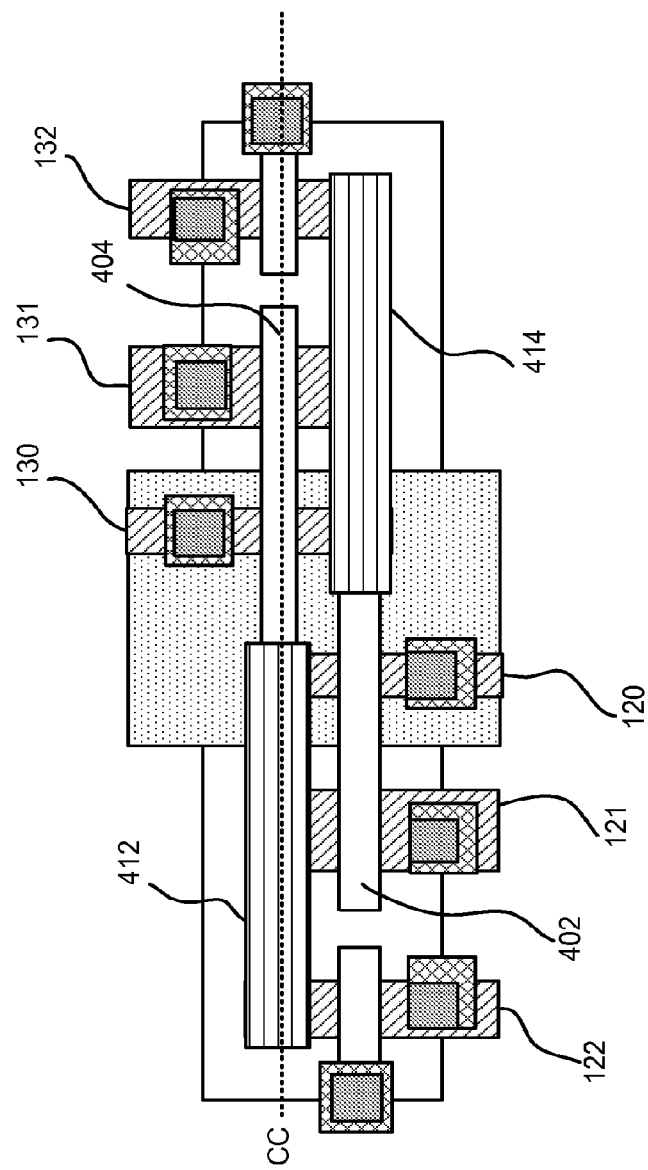
FIG. 11 shows plan view details of an exemplary memory cell including a buried conductor according to yet further aspects of the invention.
Figure 12:
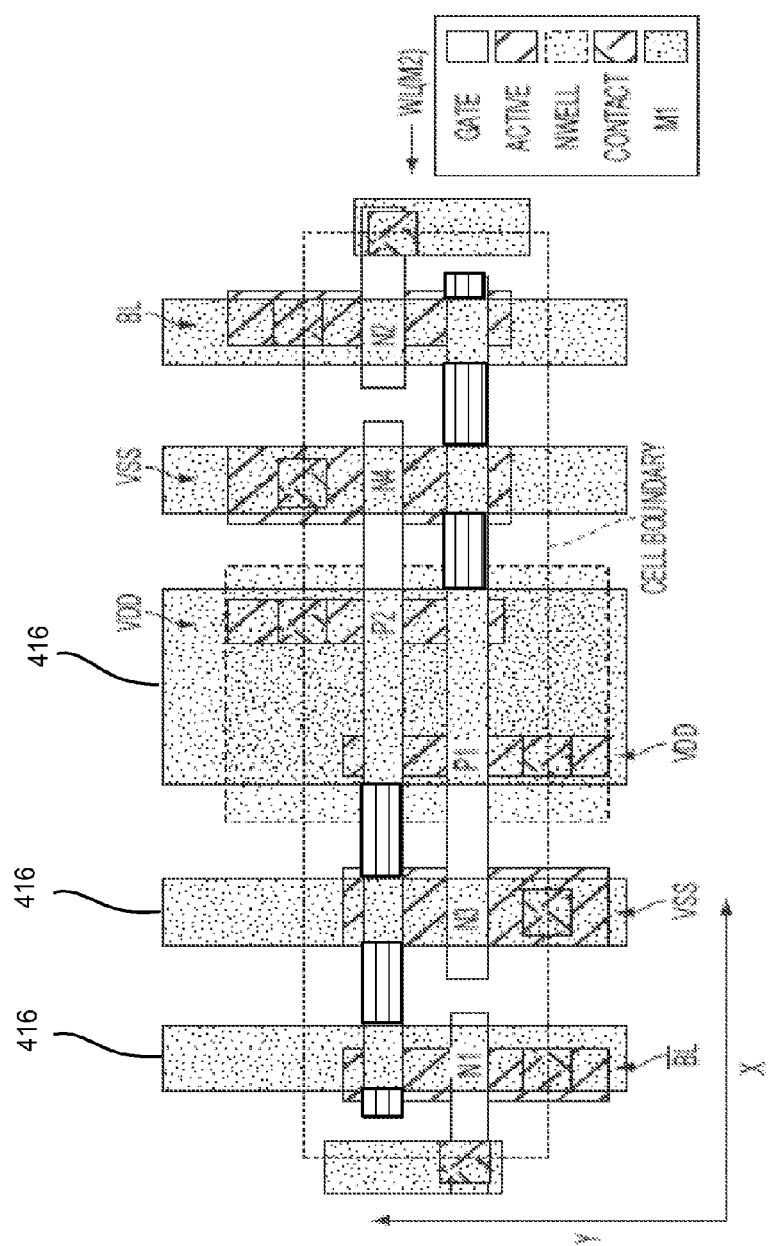
FIG. 12 shows further details of the exemplary memory cell depicted in FIG. 11 including an M1 layer with elements that are parallel to one another and orthogonal to the gate conductors according to further aspects of the invention.
Figure 13:
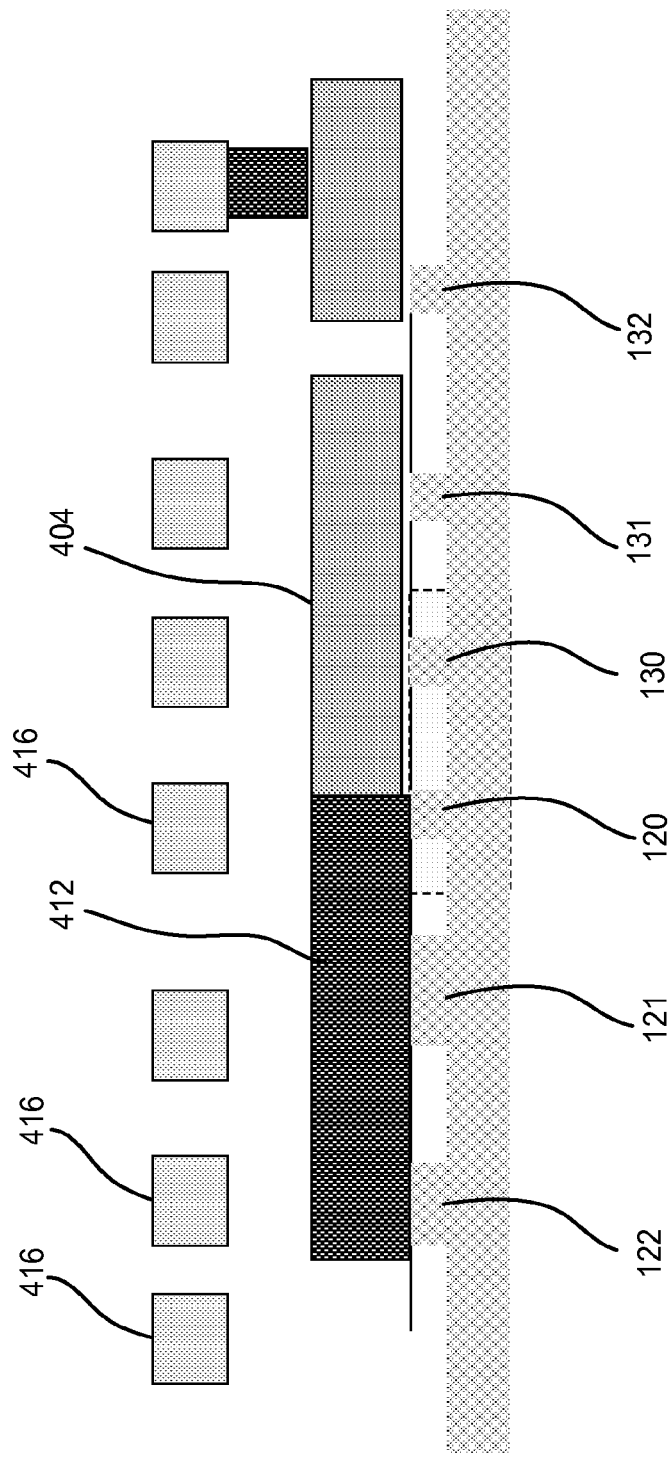
FIG. 13 shows aspects of a cross sectional view as may be found in the embodiment depicted in FIG. 11.

According to further aspects of the invention, a buried conductive layer may be included in certain embodiments. For example, in embodiments the metal 1 (M1) used to connect the internal nodes may be replaced with a metal or poly gate combined with a buried contact feature. An example of such a configuration is shown in FIGS. 11-13. This may be referred to herein as a "Type 5b" design. The embodiment shown in FIG. 11 may have several features similar to those previously described, such as substantially rectangular active areas 120, 121, 122, 130, 131, 132. However, this embodiment includes a buried conductive layer 412, 414 providing connection for one or more of a PMOS diffusion, a pull down transistor diffusion, and/or an access transistor diffusion on each side of the memory cell.

An M1 layer including lines 416 may be formed as shown in FIG. 12. As shown in FIG. 12, with the buried conductive layer, an M1 layer may be formed in a substantially vertical orientation that spans the opposing contacts of each transistor, e.g. at N1, N3, P1, P2, N4 and N2. According to embodiments such as shown in FIG. 11, a metal layer may be saved by providing connection for PMOS diffusion, pull down transistor diffusion, and access transistor diffusion via the buried conductor, e.g. allowing vertical signals such as VDD, VSS, BL, and BL bar to be routed entirely in M1 rather than in M2, while the word line (WL) could be implemented on M2. This means the cell circuit may be completed by M2 and may completely free up the area over the array for M3 wiring. Additional cross sectional details of this exemplary memory cell, cut along line CC in FIG. 11, are shown in FIG. 13.

As shown in FIG. 13, the buried conductive layer 412, 414 may be, for example, disposed lying vertically below, and electrically insulated from, an M1 layer including lines 416. Whatever the buried conductor is made of, it may be configured to contact down to the diffusion but not up to M1. This contact scheme can offer further improvement by using the metal gate to complete the internal node connections.

This process option offers several advantages, some of which may include, but not limited thereto, the following: (1) the bit cell can be fully functional for testing at M2 to reduce the delay in electrical feedback in line and (2) this wiring scheme can offer improved porosity of the M3 level, freeing up wiring tracks for logic, array power grids and reducing the critical area for M3 defects. In addition, according to aspects of the invention, the height of the cell in the BL (y) direction may also reduced from the industry standard cell providing improved performance as the BL length can be reduced.

In embodiments, the cross-coupled inverters may be included in, for example, a 6 transistor SRAM, an 8 transistor SRAM, a 6T with a 2 NMOS read buffer used as an 8T bit cell, new cross coupled pair with alternative access device schemes, cross coupled pair or 6T with alternative read buffers (8T+), etc.

Figure 14:
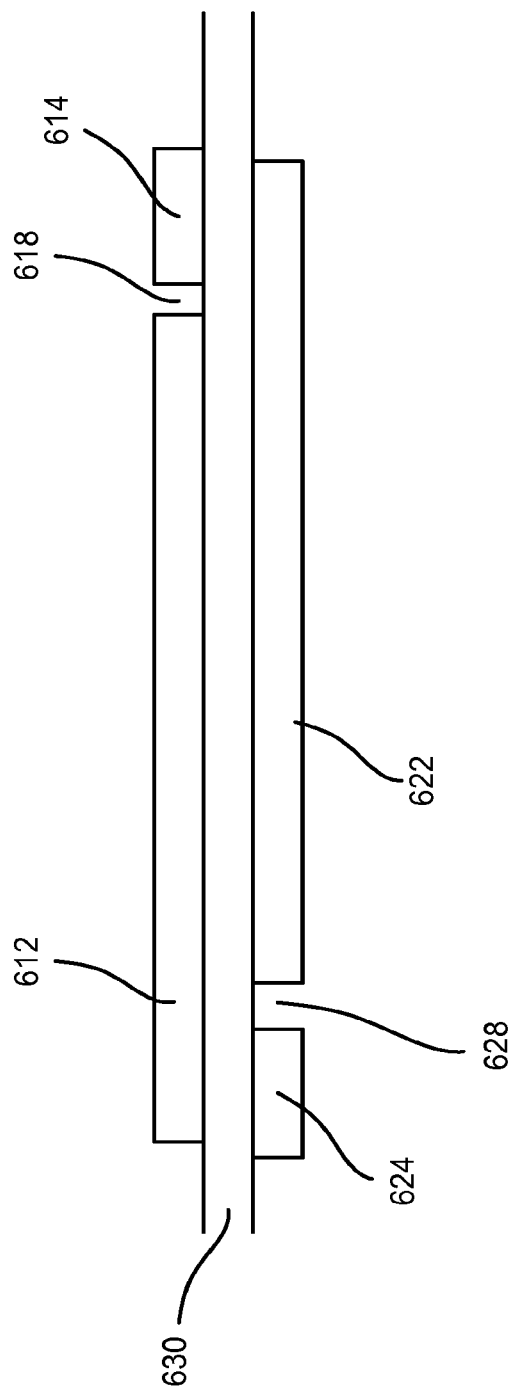
FIG. 14 shows details of an exemplary method of producing a plurality of gate conductors using a spacer.

Additional details of an exemplary fabrication process are shown in plan view in FIG. 14. As shown in FIG. 14, spacer 630 may be formed on a semiconductor stack. A pair of parallel gate conductor lines 612 and 622 may be formed on opposite sides of the spacer 630, after which the spacer may be removed. It should also be noted that the gate conductor lines 612 and 622 may be originally formed contiguously with gate conductors 614, 624, respectively. After forming the combined lines, the gate conductor lines 612 and 622 may be separated from gate conductors 614, 624, respectively, by removing material from spaces 618, 628, which may be used, for example, to leave a first gate conductor 612 and a gate conductor 614 for an access transistor. Thus, substantially rectangular gate conductors and gate conductors of the access transistors may be formed substantially unidirectionally.

According to further aspects of the invention, various other methods of manufacturing memory cells having configurations as described herein may also be provided.

Figure 15:
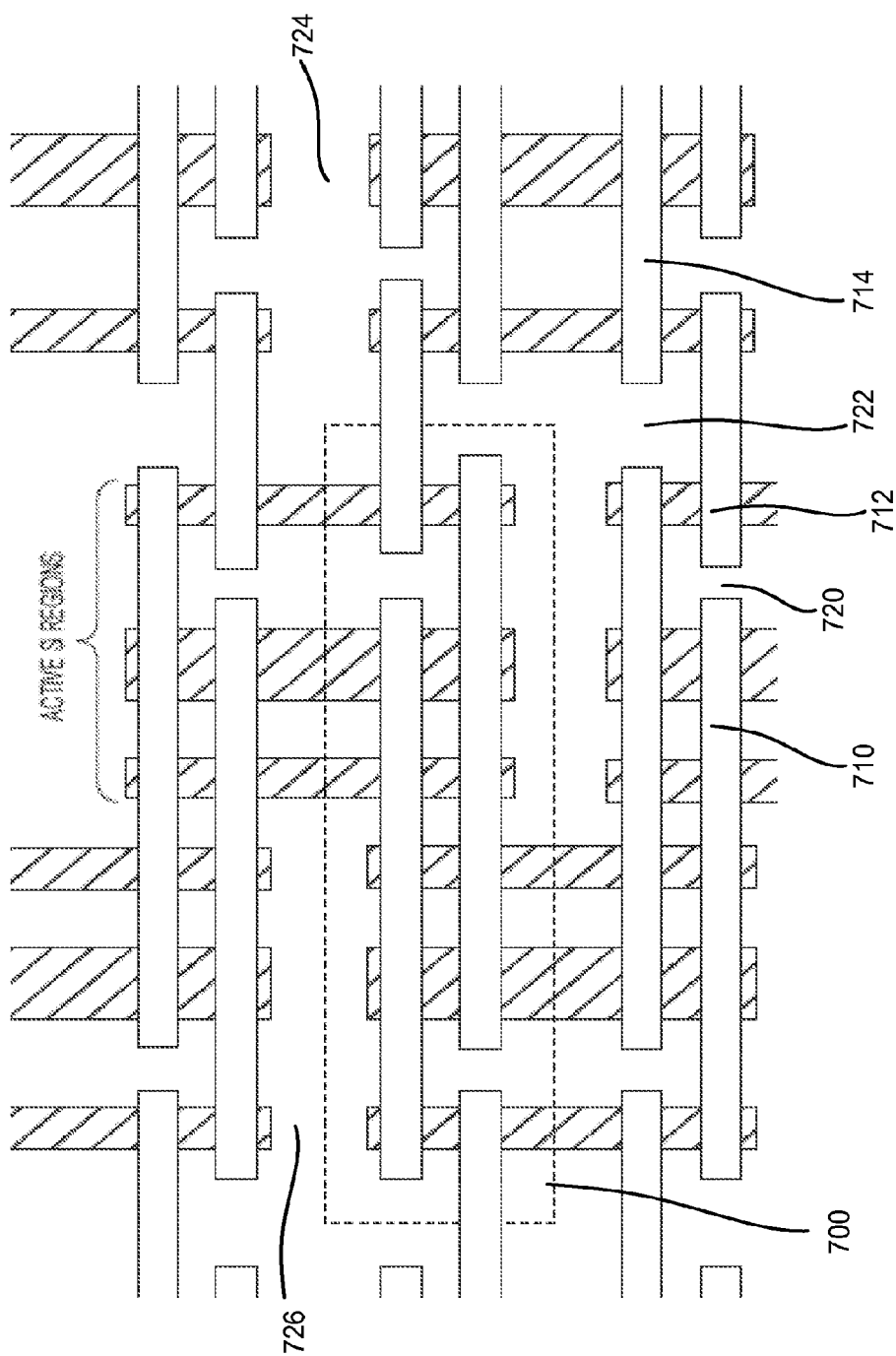
FIG. 15 shows an array of linear active regions and gate conductors formed according to aspects of the invention.

According to aspects of the invention, active silicon, gate, M1 and/or M2 may be printed as a series of straight unidirectional lines across the array, eliminating the need for complex shapes corners and jogs, and reducing systematic mismatch in the pull down NMOS devices as a result of the elimination of jogs in the active silicon. FIG. 15, shows an array of formed straight line active Si regions and gate conductors in and around a cell boundary 700. The array segment shows patterned notchless-unidirectional active silicon (vertical) and partially patterned gate lines (horizontal). These lines may be cut or otherwise patterned to remove an area of the line, such as areas 724, 726 removed from the active regions and/or areas 720, 722 removed from the gate conductors. This may be done after a set or level of lines are drawn, e.g. as described with reference to claim 14, to form, for example, a distinct inverter gate conductor 710, and a gate conductor 712 for an access transistor, from a single line.

Figure 16:
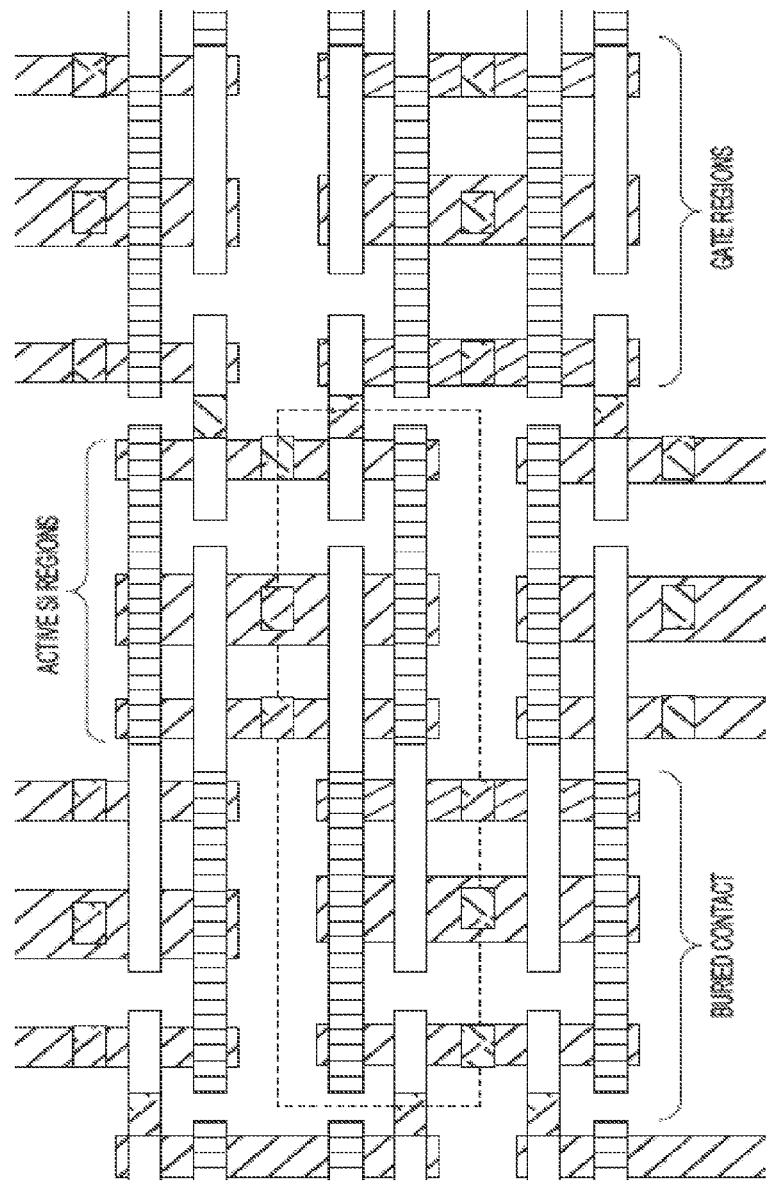
FIG. 16 shows an array of linear active regions and gate conductors, similar to those shown in FIG. 15, with additional contacts, formed according to aspects of the invention.
Figure 17:
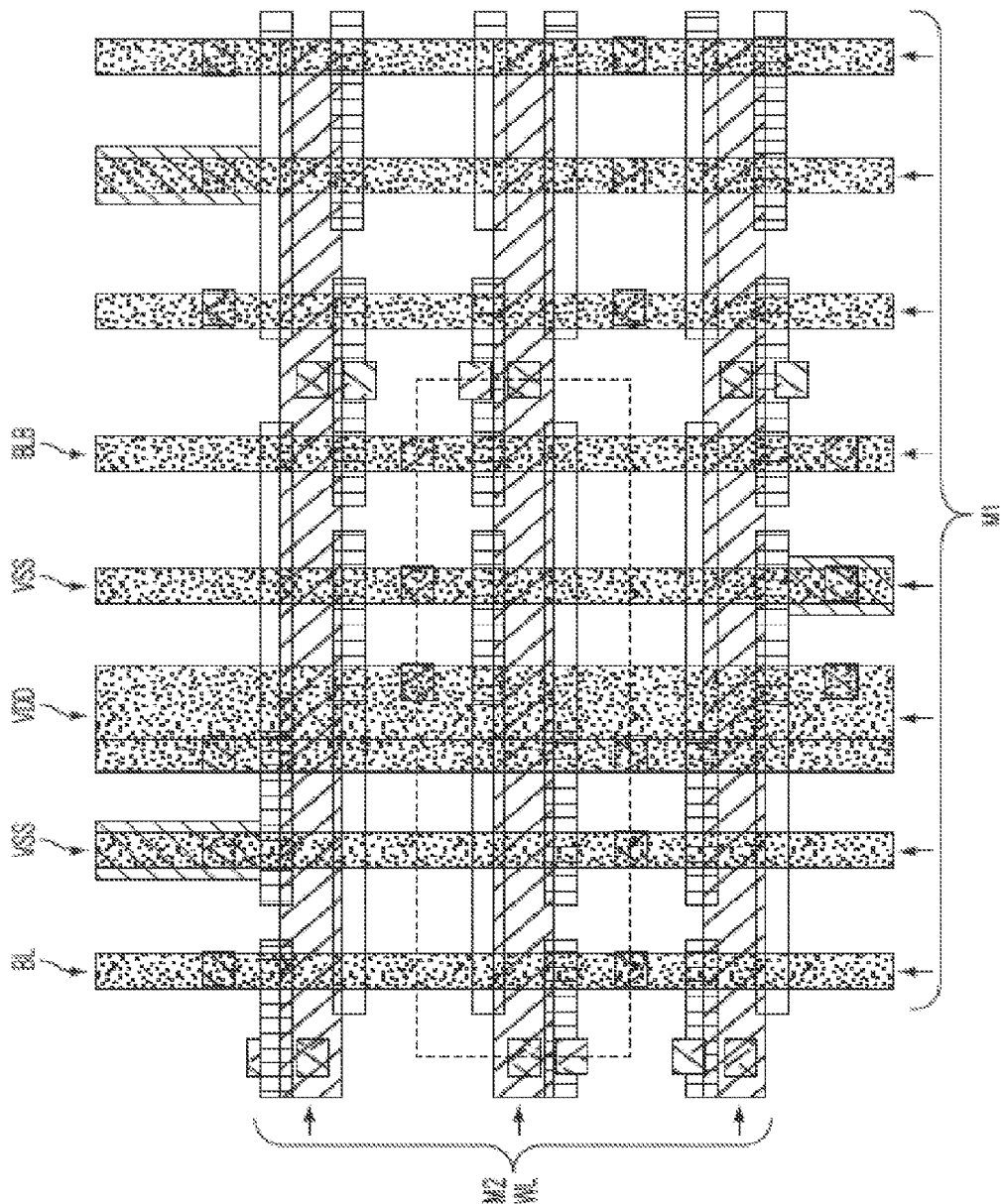
FIG. 17 shows an array of linear active regions, contacts and gate conductors, similar to those shown in FIG. 16, with additional M1 and M2 layers formed according to aspects of the invention.

FIG. 16 shows additional features of an array, such as shown in FIG. 15, after the gate cut and a replacement gate processing has been applied with buried and non-buried contacts. FIG. 17 shows a fully completed array wiring with unidirectional, vertical M1 and horizontal M2 word lines.

Some calculations related to evaluating the significance of the present subject matter are discussed below.

Sources of mismatch in dense nanoscale SRAM devices due to variations in channel doping (both random and systematic) may be attributed to the use of pushed design rules and alignment sensitive doping variation sources such as halo shadowing and lateral implant straggle. The general subject of non-random variation in dense SRAM devices may be further expanded to include the geometric sources of mismatch. These arise from the non-ideal environment associated with pushed design rules, variation in alignment and additional lithography effects such as corner rounding and line end foreshortening. These effects are layout topology dependent and can also contribute to the overall mismatch in the dense bit cell devices. Accounting for these additional components, the total variance is then expressed more fully as:

$$\sigma_{Vt_{TOTAL}}^2 = \sigma_{Vt,DF}^2 + \sigma_{Vt,GWF}^2 + \sigma_{Vt,LER}^2 + \sigma_{Vt,Weff}^2 + \sigma_{Vt,Leff}^2 \quad (1)$$

Figure 4:
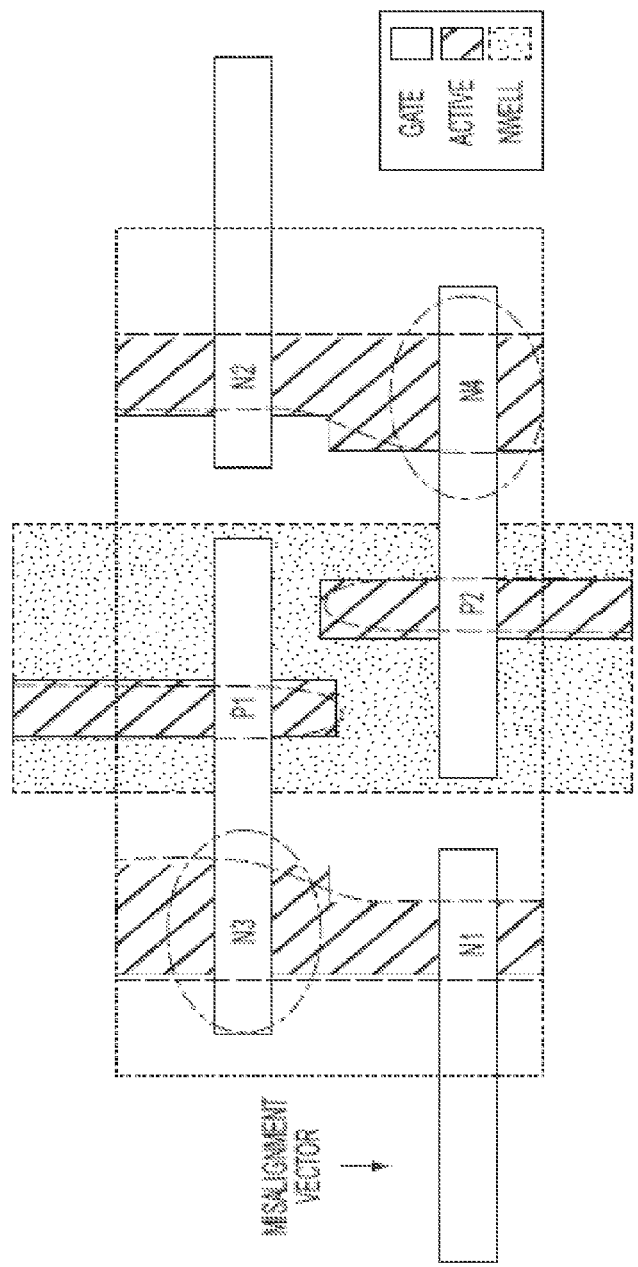
Figure 5:
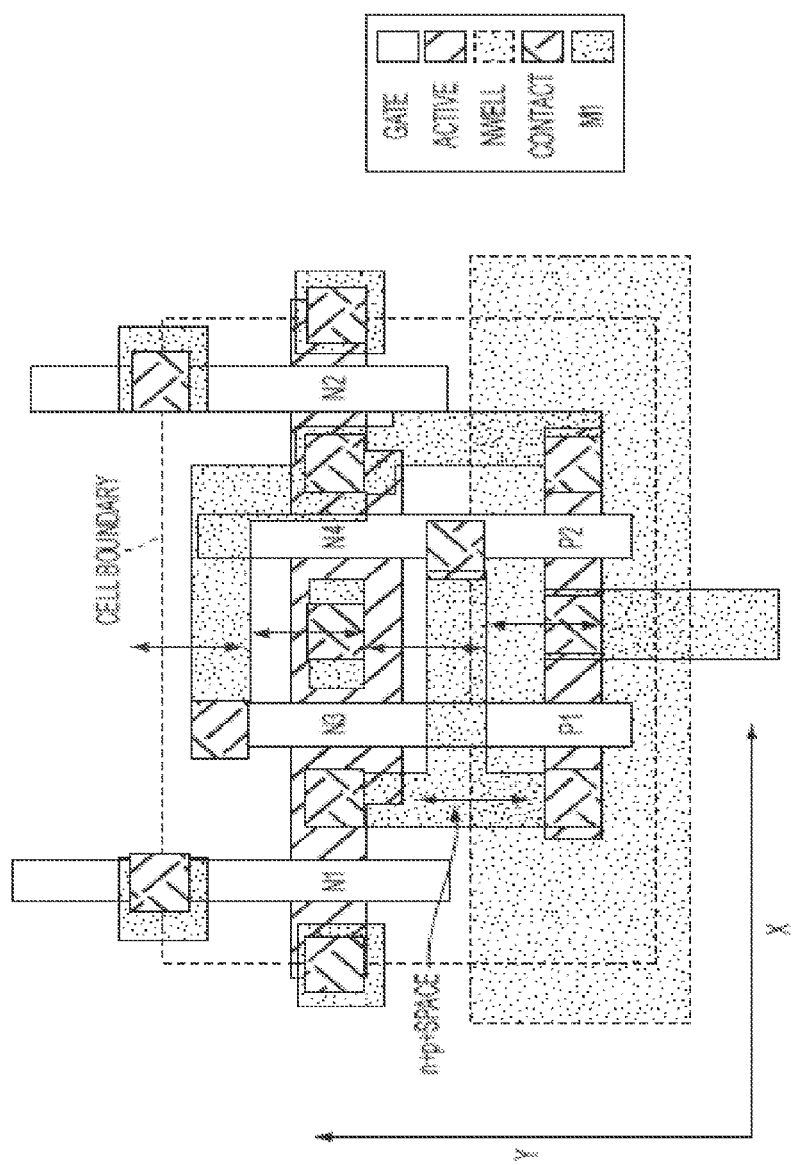
FIG. 5 shows a related art SRAM cell layout including active areas with jogs, and non-linear M1 lines.

In the above calculation, the first term, $\sigma_{Vt,DF}^2$ captures the variation in channel doping due to both random variation and sources of systematic variation. The second term, $\sigma_{Vt,GWF}^2$ captures the variation associated with the gate work function. The last three terms in (1) capture the physical or geometrical variation. While line edge roughness (LER) plays a role in the ideal logic mismatch, the last two terms are typically neglected due to the proximity assumptions of the drawn ideal mismatch structures. As illustrated in FIG. 4, and previously discussed, this is not always the case for the dense SRAM devices.

(a) Active region corner rounding is illustrated (solid lines outline of active region) with nominal gate to active alignment.

(b) With misalignment the PD NMOS devices become geometrically mismatched due to corner rounding effects associated with the jog in the active layer.

The geometry of the right (N4) and left (N3) devices, FIG. 4, become increasingly dissimilar as a function of alignment in the conventional 6T (type 4) cell. Additional variation in the Leff (not shown) can arise from similar arguments when line end foreshortening coupled with corner rounding are captured.

Figure 18:
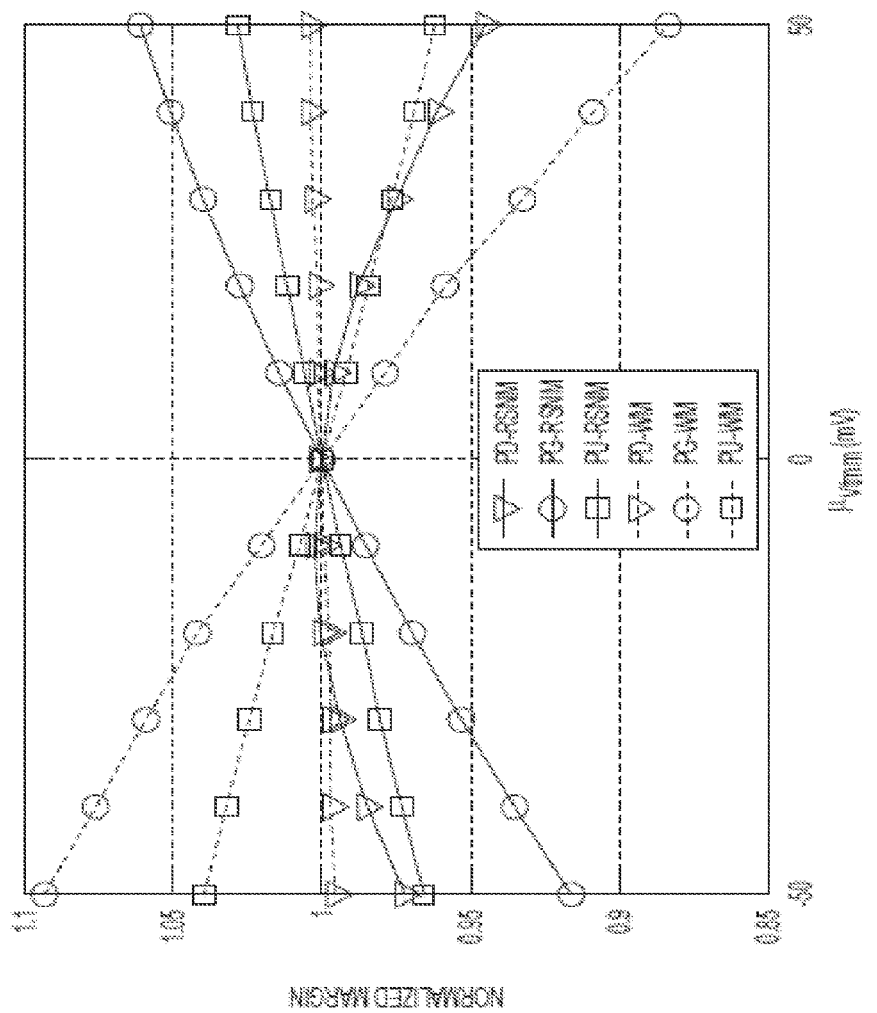
FIG. 18 is a graph showing the impact of $\mu_{V_{tmm}}$ on the mean read static noise margin (RSNM) and write margin (WM).

Normal random variation in device threshold mismatch within the bit cell device pairs is anticipated with an expected value or mean of zero. When non-random sources of mismatch introduce a mean shift in Vtmm, where ($\mu_{vtmm} \neq 0$), an impact on the functional noise margins such as read static noise margin (RSNM), or write margin (WM) may be observed. Margin simulations were conducted using a commercially available 45 nm LP technology. The impact of $\mu_{Vtmm}$ on the mean RSNM and WM is plotted in FIG. 18.

Figure 19:
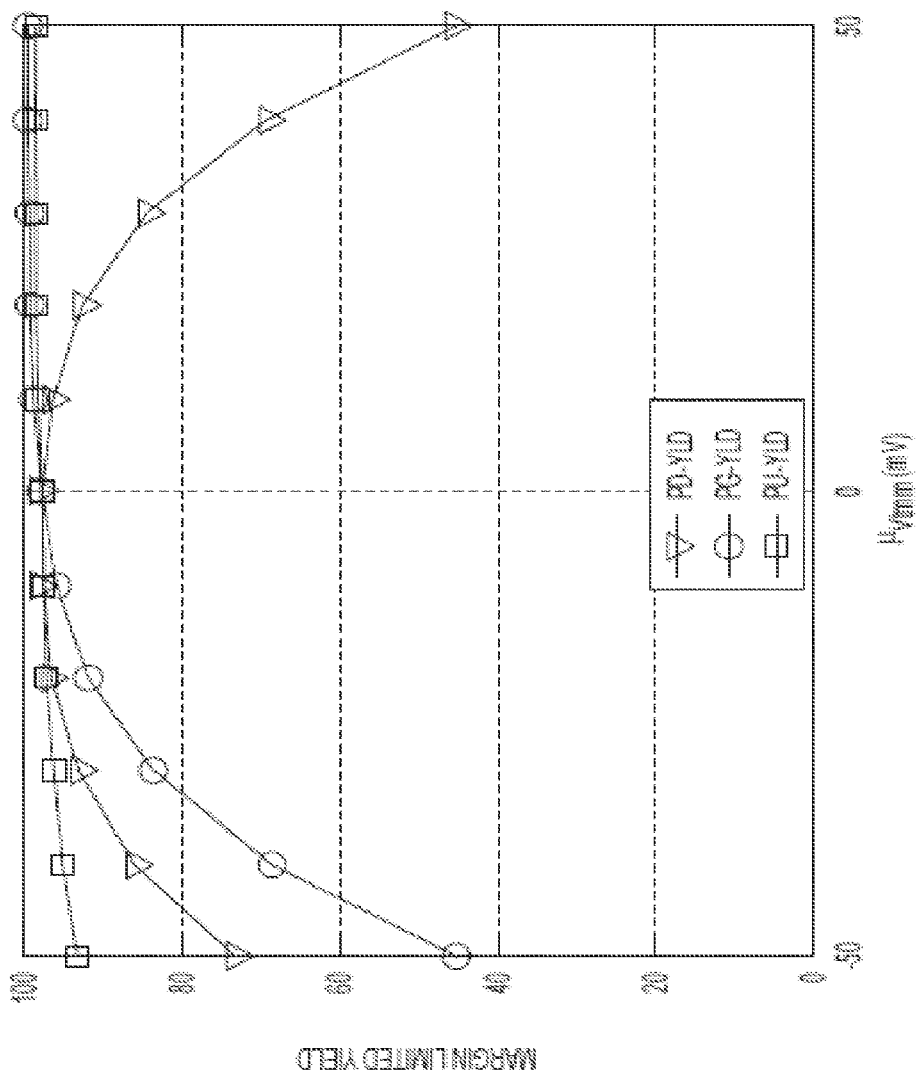
FIG. 19 is a graph showing the impact of systematic mismatch on margin limited yield for 2 Megabit SRAM.

The yield (simulated at nominal voltage and relatively small array size) associated with relatively small deviations from the expected mean of zero begins to roll off quickly. This indicates that the notched N1/N3 (N2/N4) active silicon can rapidly affect yield unless alignment tolerances are sufficiently tightened below 22 nm. The impact of systematic mismatch on margin limited yield for 2 Megabit SRAM is shown in FIG. 19.

By using the set of 'pushed' (sub-DRC) layout rules, given in Tables 1 and 2 below, optimized for the type 4 layout, the bit cell area for this topology may be estimated for comparison purposes. The rules are applied to calculate the cell area for the industry standard topology (type 4) cell and then the new bit cell option for comparison purposes.

While some deviation will be expected as technologies evolve, the rules are expressed as function of the technology node ($\lambda$) to capture the effect of scaling. Although these pushed rules are consistent with those used in industry, some differences will exist between technology suppliers to allow optimization of yield and parametric values as desired.

TABLE 1

SRAM bit cell design rule scaling assumptions

| Design rule | symbol | Dimensions ($\lambda$) |
|---|---|---|
| Gate to contact space | (GC) | 0.7 |
| Gate past active | (GPA) | 1 |
| Gate tip to tip | (TT) | 1 |
| Gate, contact to active | (GCA) | 1 |
| Contact size | (CW) | 1.4 |
| Contact space | (CS) | 1.4 |
| p+ to p+ space | (AA) | 1.7 |
| n+ to p+ space | (NP) | 1.8 |
| M1 pitch | (M1P) | 2.8 |

TABLE 2

SRAM cell device design rule scaling assumptions

| Cell device | symbol | Dimensions ($\lambda$) |
|---|---|---|
| Pull down NMOS width | (Wpd) | 2.5 |
| Pull down NMOS length | (Lpd) | 0.9 |
| Pull up PMOS width | (Wpu) | 1.4 |
| Pull up PMOS length | (Lpu) | 0.9 |
| Pass gate NMOS width | (Wpg) | 1.7 |
| Pass gate NMOS length | (Lpg) | 1.0 |

The inventors used (Wpd/Lpd), (Wpg/Lpg), (Wpu/Lpu) to refer to the width and length of the pull down NMOS, pass gate NMOS and pull up PMOS devices respectively. The dimension $X_4$ in the wordline direction for design topology 4, illustrated in FIG. 1, becomes:

$$X_4 = 2 \cdot \left( \frac{1}{2}(TT) + (GPA) + \max(Wpd, Wpg) + (NP) + Wpu + \frac{1}{2}(AA) \right) \quad (2)$$

and the dimension ($Y4$) is:

$$Y_4 = 2(CW) + 4(GC) + \max(Lpd, Lpu) + Lpg \quad (3)$$

Using the substitutions provided in Table 1 the bit cell area for topology 4 is expressed as a function of device dimensions and technology node dimension:

$$A_4 = (8.3 + 2 \cdot \max(Wpd, Wpg) + 2(Wpu))\lambda \cdot (5.6 + \max(Lpd, Lpu) + Lpg)\lambda \quad (4)$$

Given the assumptions provided in Table 2, the type 4 cell height ($Y_4$) is estimated to be approximately $7.5\lambda$. This dimension is an important metric since it dictates the bit line length for this topology. Following the same set of pushed scaling rules for the type 5 cell proposed herein, the $X_5$ dimension for an embodiment like that illustrated in FIG. 7 is estimated to be approximately:

$$X_5 = 2 \cdot \left( \frac{1}{2}(CW) + (GCA) + (Wpg) + (GPA) + \right. \quad (5)$$
$$\left. (TT) + (GPA) + (Wpd) + (NP) + (Wpu) + \frac{1}{2}(AA) \right)$$

and the dimension ($Y_5$) is calculated to be:

$$Y_5 = \quad (6)$$
$$2 \cdot \left[ \frac{1}{2}(CW) + (GC) + \frac{1}{2}(2 \cdot (CW) + (CS) - ((CW) - \max(Lpd, Lpu))) \right]$$

Using consistent assumptions the $Y_5$ estimate of $6.5\lambda$ represents a 13% reduction in the bitline length over the array. This directly corresponds to improved access speed.

The estimated cell area is:

$$A_5 = 6.5\lambda \cdot (14.7\lambda + 2\lambda \cdot (Wpu + Wpg + Wpd)) \quad (7)$$

Figure 20:
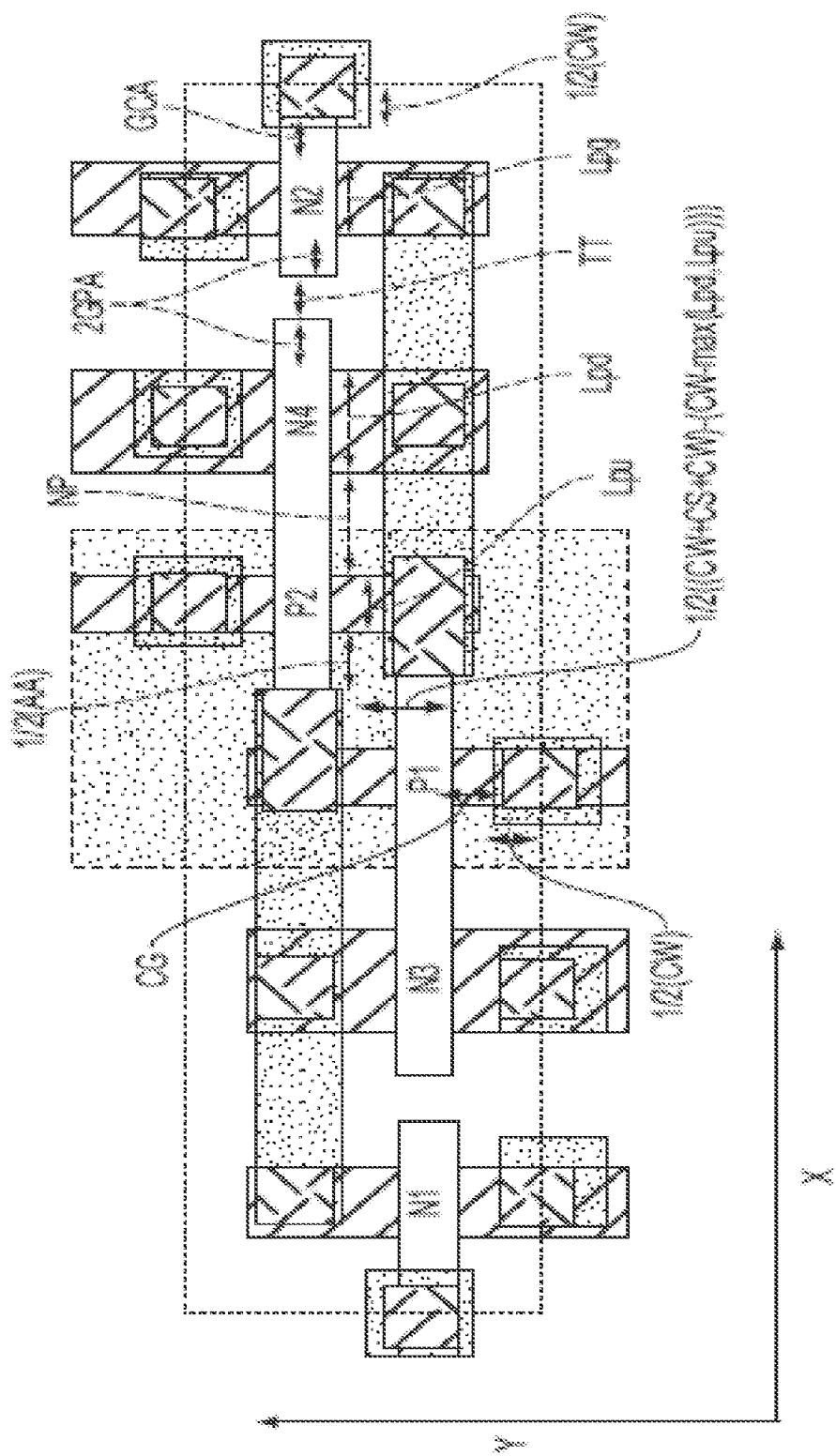
FIG. 20 shows details related to design rules for a memory cell layout according to aspects of the invention.

Using scaled and equivalent device dimensions a comparison of the calculated bit cell area results in $168.35\lambda^2$ for a cell type such as shown in FIG. 7A, and $142.45\lambda^2$ for a cell type such as shown in FIG. 9, compared to the $120\lambda^2$ estimated for the type 4 cell. The limiting design rules used to calculate the type 5 cell dimensions are highlighted in FIG. 20. Due to its lithographic friendliness, the inventors expect the area of the type 5 cell to draw closer to and perhaps less than the area of type 4 cell for technologies below 22 nm.

A layout method using an extended shared contact, such as shown in FIG. 9, may be used to illustrate a potential area improvement that could be obtained by using a pitch doubling technology. While the assumed $X_5$ value will remain equivalent to the type 5, the $Y_5$ value could be further reduced by:

$$Y_{5e} = 2\left(\frac{1}{2}(CW) + (GC) + \max(Lpd, Lpu, Lpg) + \frac{1}{2}(GS)\right) \quad (8)$$

The area for the type 5e becomes:

$$A_{5e} = 5.5\lambda \cdot (14.7\lambda + 2\lambda \cdot (Wpu + Wpg + Wpd)) \quad (9)$$

This may provide a further reduction in the BL dimension with ($Y_{5e}$) equal to 5.5 λ.

A comparison of bit cell metrics that highlight some key differences by cell type is given in Table 3. The bit cell area, BL length (LBL), and number of required metal levels is summarized. Because the number of contacts required per cell is also a metric of interest, this metric highlights an additional advantage of the type 5 topology.

TABLE 3

SRAM bit cell metric comparison by cell type

| Metric | Cell Type | | | |
| --- | --- | --- | --- | --- |
| | 4 | 5 | 5e | 5b |
| Number contacts/cell | 6 | 8 | 4 | 4 |
| Number shared contacts/cell | 2 | 2 | 2e | 2b |
| Cell area (λ²) | 120 | 168 | 142 | 142 |
| $L_{BL}$ (λ) | 7.5 | 6.5 | 5.5 | 5.5 |
| Number metal levels | 3 | 3 | 3 | 2 |

The description given above is merely illustrative and is not meant to be an exhaustive list of all possible embodiments, applications or modifications of the invention. Thus, various modifications and variations of the described methods and systems of the invention will be apparent to those skilled in the art without departing from the scope and spirit of the invention. Although the invention has been described in connection with specific embodiments, it should be understood that the invention as claimed should not be unduly limited to such specific embodiments. Indeed, various modifications of the described modes for carrying out the invention which are obvious to those skilled in the memory circuit design, memory circuit manufacture or related fields are intended to be within the scope of the appended claims.

The following patents, applications and publications as listed below and throughout this document are hereby incorporated by reference in their entirety herein.

1. M. Ishida, T. Kawakami, A. Tsuji, N. Kawamoto, M. Motoyoshi, and N. Ouchi. "A novel 6t-sram cell technology designed with rectangular patterns scalable beyond 0.18 & generation and desirable for ultra high speed operation". In Proc. International Electron Devices Meeting IEDM '98 Technical Digest, pages 201-204, 6-9 Dec. 1998.
2. Y. Zorian. "Embedded memory test and repair: infrastructure IP for SOC yield". IEEE ITC International Test Conference, 2002.
3. U.S. Pat. No. 7,176,125 B2, Liaw, "Method of Forming a Static Random Access Memory with a Buried Local Interconnect", Feb. 13, 2007.
4. U.S. Pat. No. 5,654,915, Stolmeijer, et al., "6-Bulk Transistor Static Memory Cell Using Split Wordline Architecture", Aug. 5, 1997.
5. U.S. Patent Application Publication No. US 2008/0122008 A1, Schroeder, et al., "Memory Cell", May 29, 2008.
6. U.S. Pat. No. 7,087,493 B1, Madan, "Memory with 6T Small Aspect Ratio Cells Having Metal_1 Elements Physically Connected to Metal_0 Elements", Aug. 8, 2006.
7. U.S. Pat. No. 7,271,451 B2, Liaw, "Memory Cell Structure", Sep. 18, 2007.
8. U.S. Pat. No. 7,279,755 B2, "Lee, et al., "SRAM Cell with Improved Layout Designs", Oct. 9, 2007.
9. U.S. Pat. No. 6,445,041 B1, Ishida, "Semiconductor Memory Cell Array with Reduced Parasitic Capacitance Between Word Lines and Bit Lines", Sep. 3, 2002.
10. U.S. Patent Application Publication No. US 2005/0275043 A1, Huang, et al., "Novel Semiconductor Device Design", Dec. 15, 2005.
11. U.S. Pat. No. 6,864,506 B2, Kim, et al., "SRAM Cell and Method for Fabricating the Same", Mar. 8, 2005
12. U.S. Pat. No. 6,870,231, B2, Kim, et al., "Layouts for CMOS SRAM Cells and Devices", Mar. 22, 2005.
13. U.S. Pat. No. 7,196,923 B1, Hong, et al., "Bitcell Layout", Mar. 27, 2007.
14. U.S. Pat. No. 7,236,396 B2, Houston, et al., "Area Efficient Implementation of Small Blocks in an SRAM Array", Jun. 26, 2007.
15. U.S. Pat. No. 6,569,723 B2, Liaw, "Crossed Strapped VSS Layout for Full CMOS SRAM Cell", May 27, 2003.
16. U.S. Pat. No. 6,643,167 B2, Nii, "Semiconductor Memory", Nov. 4, 2003.
17. U.S. Pat. No. 6,414,359 B1, Madan, "Six Transistor SRAM Cell Having Offset P-Channel and N-Channel Transistors", Jul. 2, 2002.
18. U.S. Pat. No. 6,445,017 B2, Song, "Full CMOS SRAM Cell", Sep. 3, 2002.
19. U.S. Pat. No. 6,445,041 B1, Ishida, "Semiconductor Memory Cell Array with Reduced Parasitic Capacitance Between Word Lines and Bit Lines", Sep. 3, 2002.
20. U.S. Pat. No. 5,654,915, Stolmeijer, et al., "6-Bulk Transistor Static Memory Cell Using Split Worldline Architecture", Aug. 5, 1997.
21. U.S. Pat. No. 5,656,861, Godinho, et al., "Self-Aligning Contact and Interconnect Structure", Aug. 12, 1997.
22. U.S. Pat. No. 5,886,375, Sun, "SRAM Having Improved Soft-Error Immunity", Mar. 23, 1999.
23. U.S. Pat. No. 6,088,259, Chi, "SRAM Cell Using Two Single Transistor Inverters", Jul. 11, 2000.
24. U.S. Pat. No. 6,188,594 B1, Ong, "Reduced-Pitch 6-Transistor NMOS Content-Addressable-Memory Cell", Feb. 13, 2001.
25. U.S. Pat. No. 5,198,683, Sivan, "Integrated Circuit Memory Device and Structural Layout Thereof", Mar. 30, 1993.
26. U.S. Pat. No. 5,521,860, Ohkubo, "CMOS Static Memory", May 28, 1996.
27. U.S. Patent Application Publication No. US 2005/0275043 A1, "Novel Semiconductor Device Design", Dec. 15, 2005.
28. U.S. Pat. No. 5,012,443, Ema, "Semiconductor Static Ram Including Load Resistors Formed on Different Layers", Apr. 30, 1991.

The disclosures of all references and publications cited above are expressly incorporated by reference in their entireties to the same extent as if each were incorporated by reference individually.

What is claimed is:

1. A method of forming a memory cell including a pair of cross coupled inverters, said method comprising:

forming a first inverter, said first inverter including a substantially rectangular first gate conductor and a first contact;

forming a second inverter, said second inverter including a substantially rectangular second gate conductor and a second contact, the second contact is substantially aligned with a long axis of the first gate conductor, and the first contact is substantially aligned with a long axis of the second gate conductor;

forming a first substantially rectangular active region that intersects at least one of the first gate conductor and the second gate conductor in plan view; and forming a second substantially rectangular active region that intersects at least one of the first gate conductor and the second gate conductor in plan view, wherein, the second active region is non-contiguous with the first active region and has a width in plan view that is greater than a width of the first active region in plan view.

2. The method of claim 1, wherein the first gate conductor and the second gate conductor are substantially formed using polycrystalline silicon.

3. The method of claim 1, wherein each of the first and second substantially rectangular active regions has a long axis that is substantially orthogonal to the long axis of the gate conductor that is intersected by the first and second substantially rectangular active regions.

4. The method of claim 1, further comprising:
forming a third substantially rectangular active region that intersects the second gate conductor in plan view;
forming a fourth substantially rectangular active region that intersects the second gate conductor in plan view,
wherein, the fourth active region is non-contiguous with the third active region and has a width in plan view that is greater than a width of the third active region in plan view, and
the first and second active regions intersect the first gate conductor in plan view.

5. The method of claim 1, wherein:
the first inverter comprises a first pull up transistor and a first pull down transistor;
the second inverter comprises a second pull up transistor and a second pull down transistor;
the first pull up transistor comprises the intersection of the first gate conductor and the first active region;
the first pull down transistor comprises the intersection of the first gate conductor and the second active region;
the second pull up transistor comprises the intersection of the second gate conductor and the third active region; and
the second pull down transistor comprises the intersection of the second gate conductor and the fourth active region.

6. The method of claim 1, wherein:
the first contact comprises a substantially rectangular extended shared contact region having a long axis and the second contact comprises a substantially rectangular extended shared contact region having a long axis;
the first active region and the second active region are electrically connected to the first contact;
the third active region and the fourth active region are electrically connected to the second contact; and
the long axis of the first contact, the long axis of the second contact, and the long axis of at least one of the first gate conductor and the second gate conductor are substantially parallel.

7. The method of claim 1, further comprising a plurality of metal lines (M1) comprising a plurality of substantially rectangular metallic regions each having a long axis, wherein the long axes of the metal lines are substantially parallel.

8. The method of claim 1, further comprising a plurality of metal lines (M1) comprising a plurality of substantially rectangular metallic regions each having a long axis, comprising a first metal line and a second metal line, wherein the long axis of the second metal line is substantially aligned with the first gate conductor and the long axis of the first metal line is substantially aligned with the second gate conductor.

9. A method of forming a memory cell including a pair of cross coupled inverters, said method comprising:
forming a metal 1 layer;
forming a first inverter, said first inverter including a substantially rectangular first gate conductor and a first contact;
forming a second inverter, said second inverter including a substantially rectangular second gate conductor and a second contact, the second contact substantially aligned with a long axis of the first gate conductor, and the first contact substantially aligned with a long axis of the second gate conductor; and
forming a buried conductive layer, the buried conductive layer providing connection for a PMOS diffusion, a pull down transistor diffusion, and an access transistor diffusion on each side of the memory cell, and the buried conductive layer lying vertically below and electrically insulated from the metal 1 layer.

10. The method of claim 9, wherein the cross-coupled inverters are included in at least one of a 6 transistor SRAM, and an 8 transistor SRAM.

11. A method of forming a memory cell, comprising:
forming a plurality of substantially rectangular gate conductors;
forming a plurality of substantially rectangular active regions; and
forming a plurality of metal lines (M1),
wherein, the plurality of gate conductors are substantially orthogonal to the plurality of active regions,
the plurality of active regions comprises a first active region and a second active region intersecting at least one of the plurality of gate conductors in plan view, and
the second active region is non-contiguous with the first active region and has a width in plan view that is larger than a width of the first active region.

12. The method of claim 11, wherein the plurality of gate conductors is substantially formed using polycrystalline silicon.

13. The method of claim 11, wherein the plurality of gate conductors is substantially formed using metal.

14. The method of claim 11, wherein each active region has a long axis, and the long axes of the active regions are substantially parallel.

15. The method of claim 11, wherein:
the plurality of metal lines (M1) are substantially rectangular,
each of the plurality of gate conductors are substantially parallel to one another,
the plurality of active regions are substantially parallel to one another, and
the plurality of metal lines (M1) are substantially parallel to the plurality of gate conductors.

* * * * *